United States Patent
Liang et al.

(10) Patent No.: US 11,502,166 B2
(45) Date of Patent: *Nov. 15, 2022

(54) SEAL MATERIAL FOR AIR GAPS IN SEMICONDUCTOR DEVICES

(71) Applicant: Taiwan Semiconductor Manufacturing Co., Ltd., Hsinchu (TW)

(72) Inventors: Shuen-Shin Liang, Hsinchu County (TW); Chen-Han Wang, Hsinchu County (TW); Keng-Chu Lin, Ping-Tung (TW); Tetsuji Ueno, Hsinchu (JP); Ting-Ting Chen, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/100,533

(22) Filed: Nov. 20, 2020

(65) Prior Publication Data

US 2021/0193799 A1 Jun. 24, 2021

Related U.S. Application Data

(63) Continuation-in-part of application No. 16/937,344, filed on Jul. 23, 2020.
(Continued)

(51) Int. Cl.
*H01L 29/06* (2006.01)
*H01L 29/417* (2006.01)
(Continued)

(52) U.S. Cl.
CPC .. *H01L 29/0653* (2013.01); *H01L 21/823431* (2013.01); *H01L 29/41783* (2013.01);
(Continued)

(58) Field of Classification Search
CPC ....... H01L 21/28141; H01L 21/823431; H01L 21/823821; H01L 21/845; H01L 27/0886; H01L 27/0924; H01L 27/10879; H01L 27/1211; H01L 29/0653; H01L 29/41783; H01L 29/41791; H01L 29/665; H01L 29/6653; H01L 29/66553; H01L 29/6656; H01L 29/66795; H01L 29/785; H01L 29/7851; H01L 29/7853; H01L 29/7855; H01L 2029/7858
See application file for complete search history.

(56) References Cited

U.S. PATENT DOCUMENTS 9,105,490 B2 8/2015 Wang et al.
9,236,267 B2 1/2016 De et al.
(Continued)

*Primary Examiner* — David C Spalla
(74) *Attorney, Agent, or Firm* — Sterne, Kessler, Goldstein & Fox P.L.L.C.

(57) ABSTRACT

The present disclosure relates to a semiconductor device including first and second terminals formed on a fin region and a seal layer formed between the first and second terminals. The seal layer includes a silicon carbide material doped with oxygen. The semiconductor device also includes an air gap surrounded by the seal layer, the fin region, and the first and second terminals.

20 Claims, 26 Drawing Sheets

Related U.S. Application Data

(60) Provisional application No. 62/951,852, filed on Dec. 20, 2019.

(51) Int. Cl.
  *H01L 29/66* (2006.01)
  *H01L 29/78* (2006.01)
  *H01L 21/8234* (2006.01)

(52) U.S. Cl.
  CPC ...... *H01L 29/41791* (2013.01); *H01L 29/665* (2013.01); *H01L 29/66795* (2013.01); *H01L 29/7851* (2013.01)

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,608,065 B1 * | 3/2017 | Bergendahl ......... H01L 27/0886 |
| 9,831,183 B2 | 11/2017 | Lin et al. |
| 9,859,386 B2 | 1/2018 | Ho et al. |
| 10,832,962 B1 * | 11/2020 | Cheng ................ H01L 29/66545 |
| 11,296,187 B2 * | 4/2022 | Liang ................ H01L 29/41791 |
| 2019/0172752 A1 * | 6/2019 | Hsu .................... H01L 29/66795 |
| 2019/0296123 A1 * | 9/2019 | Lee .................... H01L 21/02167 |
| 2019/0378909 A1 * | 12/2019 | Cheng ................ H01L 21/7682 |
| 2021/0193798 A1 * | 6/2021 | Liang .................... H01L 29/785 |

* cited by examiner

SEAL MATERIAL FOR AIR GAPS IN SEMICONDUCTOR DEVICES

This application is a continuation-in-part of U.S. patent application Ser. No. 16/937,344, titled "Seal Material for Air Gaps in Semiconductor Devices," which was filed on Jul. 23, 2020, which claims the benefit of U.S. Provisional Patent Application No. 62/951,852, titled "Seal Material for Air Gaps in Semiconductor Devices," which was filed on Dec. 20, 2019, all of which are incorporated herein by reference in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has increased while geometry size (e.g., the smallest component or line that can be created using a fabrication process) has decreased. This scaling process provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
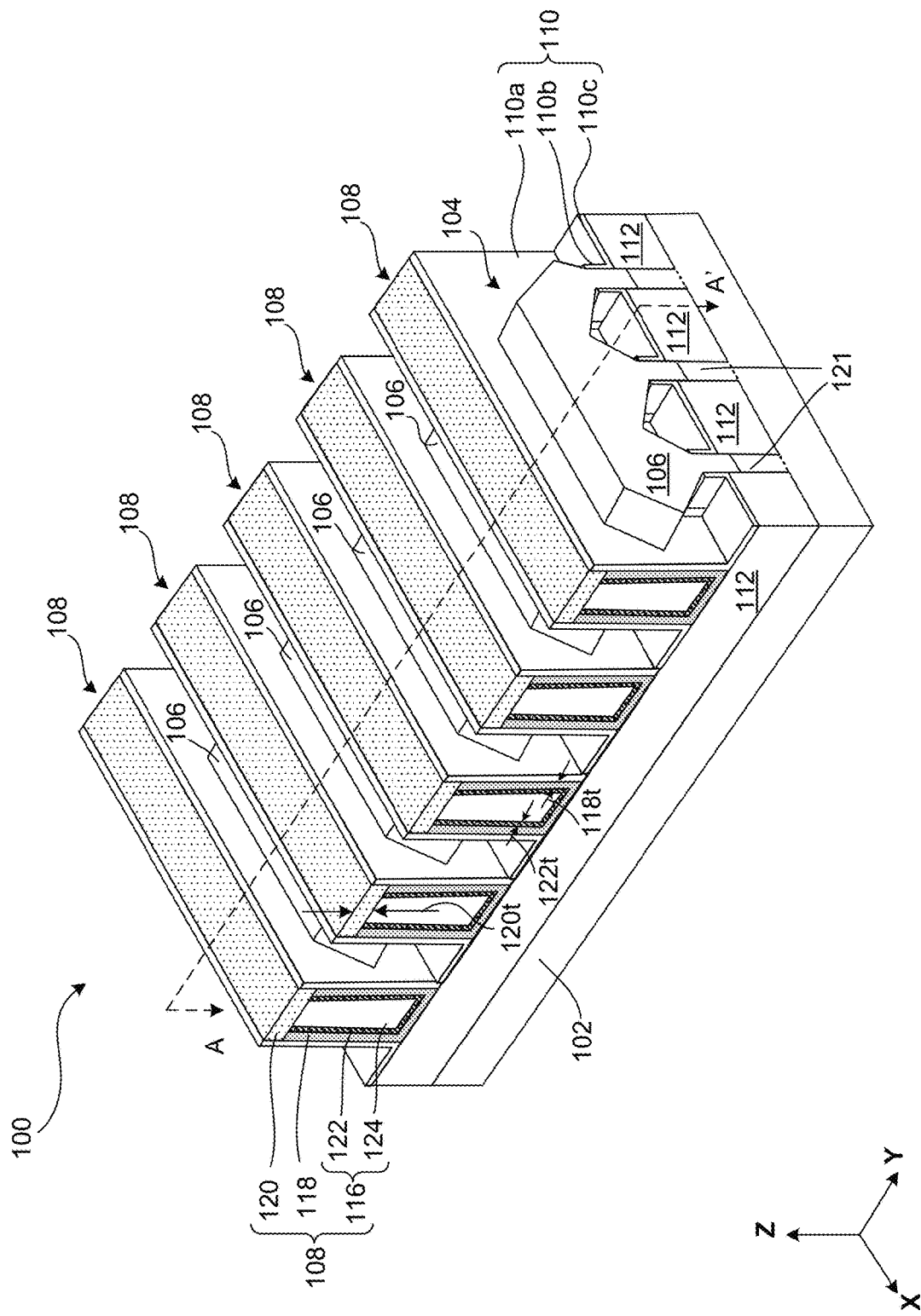
FIG. 1 is an isometric view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in physical contact, and may also include embodiments in which additional features are disposed between the first and second features, such that the first and second features are not in physical contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of a target value (e.g., ±1%, ±2%, ±3%, ±4%, ±5% of the target value).

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As planar semiconductor devices, such as metal-oxide-semiconductor field effect transistors ("MOSFETs"), are scaled down through various technology nodes, other approaches to increase device density and speed have been advanced. One approach is the fin field effect transistor ("finFET") device that is a three-dimensional FET that includes the formation of a fin-like channel extending from the substrate. FinFETs are compatible with conventional complementary metal-oxide-semiconductor (CMOS) processes and their three-dimensional structure allows them to be aggressively scaled while maintaining gate control and mitigating short channel effects. Gate stacks are used in planar and three-dimensional FETs for controlling the conductivity of the semiconductor device. A gate stack including a gate dielectric layer and a gate electrode for a finFET device can be formed by a replacement gate process where a polysilicon sacrificial gate structure is replaced by a metal gate structure. Gate dielectric layers, such as a high-k dielectric layer (e.g., a dielectric layer having dielectric constant greater than about 3.9), is formed between the channel and the gate electrode. Spacers can be disposed on sidewalls of the gate stack to protect the gate structures during fabrication processes, such as ion implantation, gate replacement process, epitaxial source/drain structure formation, and other suitable processes. Air gaps can be used in place of spacers to reduce the effective dielectric constant that in turn can reduce parasitic capacitance and improve device performance. Air gaps can be formed by depositing a seal material over an opening between terminals of a semiconductor device such that a pocket of air is trapped between the terminals. A seal material or a seal layer can be a structure that serves as a cap to enclose an opening. As the dielectric constant of air can be lower than a dielectric material, the effective dielectric constant can be reduced. However, low conformity and low etch resistance in the seal material can lead to defects in the semiconductor device. For example, fabrication processes for forming interconnect structures, such as vias for the metal source/drain and gate terminals of finFET devices, can involve multiple etching and cleaning processes performed on the terminals that can etch through portions of the seal material through the seams and cause damage to the air gaps. Examples of the damages can include the collapse of the seal material or trapping chemical solutions within the air gap. In addition, seams in the seal material can also cause physical breakdowns and electrical shorts. The damaged air gap structure can cause defects in the semiconductor device and lead to low device yield and device failure.

To address the above shortcomings, the present disclosure provides a semiconductor device and method of fabricating the same to provide simple and cost-effective structures and process for producing seal layers in semiconductor devices. The seal layers can be used to seal an opening and form air gaps between terminals of semiconductor devices and can also be used as a contact etch stop layer (CESL) for subsequently-formed structures, such as interconnect structures. Specifically, a highly rigid layer can be used as the seal material. For example, a layer of highly rigid silicon carbide doped with oxygen (HRSCO) can be used as a seal material. The HRSCO layer can also be formed and used as an etch stop layer. In addition, the layer of HRSCO can also be formed on top surfaces of semiconductor device terminals and used as self-aligned contacts (SACs). For example, the highly rigid layer can also be formed on terminals of semiconductor devices. The terminals can include a source terminal, a drain terminal, a gate terminal, and/or other suitable structures.

In some embodiments, the highly rigid layer can be formed by a deposition process followed by a treatment process. For example, a silicon carbide layer can be deposited followed by an oxygen anneal process to increase the oxygen content in the deposited layer. Various deposition parameters can be changed to adjust the film's density and a greater density can provide for greater rigidity. The highly rigid layer can be deposited in openings formed between opposing sidewalls of semiconductor device terminals. The highly rigid layer can be deposited on the sidewalls and towards the top of an opening, and the deposition process can continue at least until the highly rigid material from opposing sidewalls are merged to become in physical contact and form an enclosed space between the opposing sidewalls.

In some embodiments, increasing the density of the highly rigid layer can provide greater etch resistance. In some embodiments, lowering the deposition rate of the highly rigid layer can result in improved film conformity (e.g., uniform thickness). In some embodiments, the highly rigid layer can be deposition using suitable deposition process that use suitable precursors, such as tetramethyldisiloxane (TSMDSO), hydrogen, oxygen, and any other suitable precursors.

In some embodiments, the highly rigid layer is a bilayer seal material that can be formed by depositing a first seal material, depositing a second seal material, and performing at least one treatment process on the deposited first and second seal materials. The treatment process can be performed after the deposition of the first seal material, after the deposition of the second seal material, or both. The first and second seal materials can be dielectric materials. The first seal material is deposited on portions of opposing sidewalls towards the top of an opening and a second seal material is deposited on the first seal material and on exposed surfaces in the opening. The second seal material is deposited on the first seal material that is on the opposing sidewalls. The deposition process of the second seal material continues at least until the second seal material from opposing sidewalls are merged to form an enclosed space between the opposing sidewalls. A treatment process can be performed on the deposited first and second seal materials such that seams are removed by the expansion of at least the second seal material. In some embodiments, the treatment process can be an anneal process performed in an oxygen ambient environment. In some embodiments, the first seal material can be deposited at a greater deposition rate than that of the second seal material. In some embodiments, the first and second seal materials can be formed using precursors, such as tetramethyldisiloxane (TSMDSO), hydrogen, oxygen, and any other suitable precursors.

FIG. 1 is an isometric view of exemplary fin field effect transistors (finFETs) structures. FIGS. 2-7 provide various exemplary semiconductor structures and fabrication processes that illustrate the formation of multi-spacer structures having air gaps and highly rigid seal materials, in accordance with some embodiments. FIGS. 8-16 provide various structures and fabrication process for forming air gaps, seal materials, a CESL, and other structures of the semiconductor device. The seal materials and CESL can be formed using a highly rigid material that provides, among other things, greater etch resistance, improved conformity, and lower leak current. In some embodiments, the highly rigid material can be a material of HRSCO. The fabrication processes provided herein are exemplary, and alternative processes in accordance with this disclosure can be performed (though they are not shown in these figures).

FIG. 1 is an isometric view of a finFET, according to some embodiments. FinFET 100 can be included in a microprocessor, memory cell, or other integrated circuit. The view of finFET 100 in FIG. 1 is shown for illustration purposes and may not be drawn to scale. FinFET 100 may include further suitable structures, such as additional spacers, liner layers, contact structures, and any other suitable structures, are not illustrated in FIG. 1 for the sake of clarity.

FinFET 100 can be formed on a substrate 102 and can include a fin structure 104 having fin regions 121 and S/D regions 106, gate structures 108 disposed on fin structures 104, spacers 110 disposed on opposite sides of each of gate structures 108, and shallow trench isolation (STI) regions 112. FIG. 1 shows five gate structures 108. However, based on the disclosure herein, finFET 100 can have more or fewer gate structures. In addition, finFET 100 can be incorporated into an integrated circuit through the use of other structural components—such as S/D contact structures, gate contact structures, conductive vias, conductive lines, dielectric layers, and passivation layers—that are omitted for the sake of clarity.

Substrate 102 can be a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structure 104 represents current-carrying structures of finFET 100 and can traverse along a Y-axis and through gate structures 108. Fin structure 104 can include: (i) portions of fin regions 121 underlying gate structures 108; and (ii) S/D regions 106 disposed on portions of fin regions 121 that are formed on opposing sides of each of gate structures 108. Portions of fin regions 121 of fin structure 104 under gate structures 108 (not shown in FIG. 1) can extend above STI regions 112 and can be wrapped around by corresponding one of gate structures 108. Fin regions 121 on opposing sides of gate structures 108 can be etched back such that S/D regions 106 can be epitaxially grown on the etched back portions of fin regions 121.

Fin regions 121 of fin structure 104 can include material similar to substrate 102. S/D regions 106 can include an epitaxially grown semiconductor material. In some embodiments, the epitaxially grown semiconductor material is the same material as substrate 102. In some embodiments, the epitaxially grown semiconductor material includes a different material from substrate 102. The epitaxially grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. Other materials for fin structure 104 are within the scope of this disclosure.

In some embodiments, S/D regions 106 can be grown by (i) chemical vapor deposition (CVD), such as by low pressure CVD (LPCVD), ultrahigh vacuum CVD (UHVCVD), reduced pressure CVD (RPCVD), or a suitable CVD process; (ii) molecular beam epitaxy (MBE) processes; (iii) a suitable epitaxial process; and (iv) combinations thereof. In some embodiments, S/D regions 106 can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 106 can be grown by selective epitaxial growth (SEG), where an etching gas is added to promote the selective growth of semiconductor material on the exposed surfaces of fin structures, but not on insulating material (e.g., dielectric material of STI regions 112). Other methods for epitaxially growing S/D regions 106 are within the scope of this disclosure.

S/D regions 106 can be p-type regions or n-type regions. In some embodiments, p-type S/D regions 106 can include SiGe and can be in-situ doped during epitaxial growth using p-type dopants, such as boron, indium, and gallium. For p-type in-situ doping, p-type doping precursors, such as diborane ($B_2H_6$), boron trifluoride ($BF_3$), and other p-type doping precursors, can be used. In some embodiments, n-type S/D regions 106 can include Si and can be in-situ doped during an epitaxial growth process using n-type dopants, such as phosphorus and arsenic. For n-type in-situ doping, n-type doping precursors, such as phosphine ($PH_3$), arsine ($AsH_3$), and other n-type doping precursors, can be used. In some embodiments, S/D regions 106 are not in-situ doped, and an ion implantation process is performed to dope S/D regions 106.

Spacer 110 can include spacer portions 110a that form on sidewalls of gate structure 108 and are in contact with dielectric layer 118, spacer portions 110b that form on sidewalls of fin structure 104, and spacer portions 110c that form as protective layers on STI regions 106. Each spacer portion can also be a multi-spacer structure including more than one spacer structure. For example, spacer portion 110a can include more than one spacer and an air gap formed between gate structure 108 and fin structure 104. A seal material can be formed over the air gap to enclose and protect the air gap from subsequent fabrication processes. The air gap and seal material are not shown in FIG. 1 for simplicity. Spacers 110 can include insulating material, such as silicon oxide, silicon nitride, a low-k material, and a combination thereof. Spacers 110 can have a low-k material with a dielectric constant less than 3.9 (e.g., less than 3.5, 3, and 2.8). As air gaps can have dielectric constant about 1, the effective dielectric constant of spacers 110 can be further reduced compared to spacers formed using only low-k material. The low-k material for spacers 110 can be formed using suitable deposition processes, such as an atomic layer deposition (ALD). In some embodiments, spacers 110 can be deposited using CVD, LPCVD, UHVCVD, RPCVD, physical vapor deposition (PVD), any other suitable deposition processes, and combinations thereof. In some embodiments, the seal material can be a highly rigid material such as HRSCO. In some embodiments, the seal material can be a bilayer seal material formed by depositing a first seal material on top portions of an opening formed between gate structures 108 and S/D regions 106, followed by a deposition of second seal material on the first seal material to form an enclosure having air trapped in the opening. Other materials and thicknesses for spacers 110 and seal material are within the scope of this disclosure.

Each gate structure 108 can include a gate electrode 116, a dielectric layer 118 adjacent to and in contact with gate electrode 116, and a gate capping layer 120. Gate structures 108 can be formed by a gate replacement process.

In some embodiments, dielectric layer 118 can be formed using a high-k dielectric material (e.g., dielectric material having dielectric constant greater than about 3.9). Dielectric layer 118 can be formed by CVD, atomic layer deposition (ALD), physical vapor deposition (PVD), e-beam evaporation, or other suitable processes. In some embodiments, dielectric layer 118 can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, $ZrO_2$, and $ZrSiO_2$, (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric layer 118 can include a single layer or a stack of insulating material layers. Other materials and formation methods for dielectric layer 118 are within the scope of this disclosure. For example, portions of dielectric layer 118 are formed on horizontal surfaces, such as top surface of STI regions 112. Although not visible in FIG. 1, dielectric layer 118 can also be formed on top and sidewalls of fin regions 121 that are under gate electrode 116. In some embodiments, dielectric layer 118 is also formed between sidewalls of gate electrode 116 and spacer portions 110a, as shown in FIG. 1. In some embodiments, dielectric layer 118 have a thickness 118t in a range of about 1 nm to about 5 nm.

Gate electrode 116 can include a gate work function metal layer 122 and a gate metal fill layer 124. In some embodiments, gate work function metal layer 122 is disposed on dielectric layer 118. Gate work function metal layer 122 can include a single metal layer or a stack of metal layers. The stack of metal layers can include metals having work functions similar to or different from each other. In some embodiments, gate work function metal layer 122 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and combinations thereof. Gate work function metal layer 122 can be formed using a suitable process, such as ALD, CVD, PVD, plating, or combinations thereof. In some embodiments, gate work function metal layer 122 has a thickness 122t in a range from about 2 nm to about 15 nm. Other materials, formation methods, and thicknesses for gate work function metal layer 122 are within the scope of this disclosure.

Gate metal fill layer 124 can include a single metal layer or a stack of metal layers. The stack of metal layers can include metals different from each other. In some embodiments, gate metal fill layer 124 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate metal fill layer 124 can be formed by ALD, PVD, CVD, or other suitable deposition processes. Other materials and formation methods for gate metal fill layer 124 are within the scope of this disclosure.

In some embodiments, gate capping layer 120 can have a thickness 120t in a range from about 5 nm to about 50 nm and can protect gate structure 108 during subsequent processing of finFET 100. Gate capping layer 120 can include nitride material, such as silicon nitride, silicon-rich nitride, and silicon oxynitride. Other materials for gate capping layer 120 are within the scope of this disclosure.

STI regions 112 can provide electrical isolation to finFET 100 from neighboring active and passive elements (not illustrated herein) integrated with or deposited onto substrate 102. STI regions 112 can have a dielectric material, such as silicon oxide, silicon nitride, silicon oxynitride, fluorine-doped silicate glass (FSG), a low-k dielectric material, and other suitable insulating materials. In some embodiments, STI regions 112 can include a multi-layered structure. The cross-sectional shapes of fin structure 104, S/D regions 106, gate structures 108, spacers 110, and STI regions 112 are illustrative and are not intended to be limiting.

Figure 5:
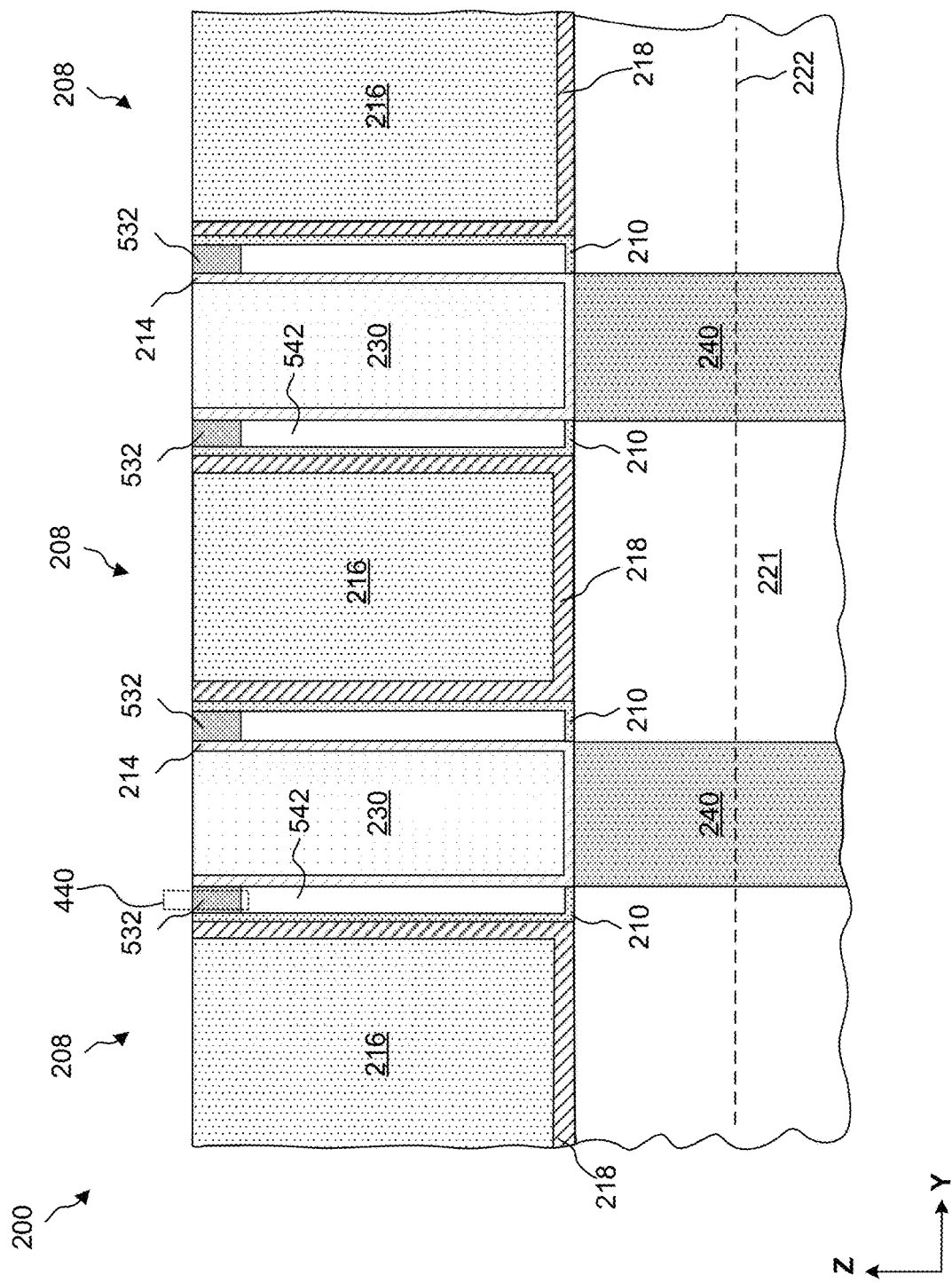
Figure 6:
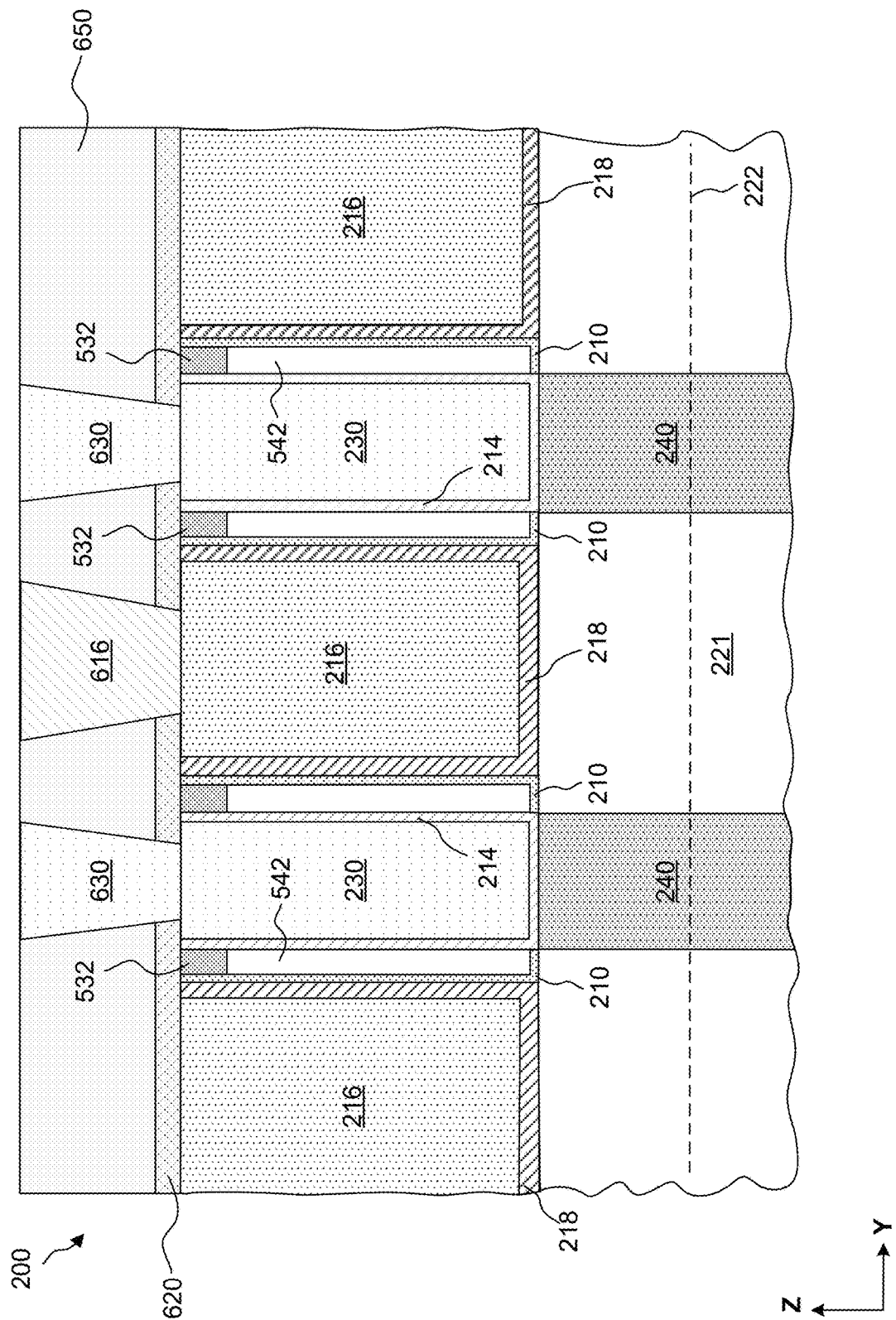
Figure 7:
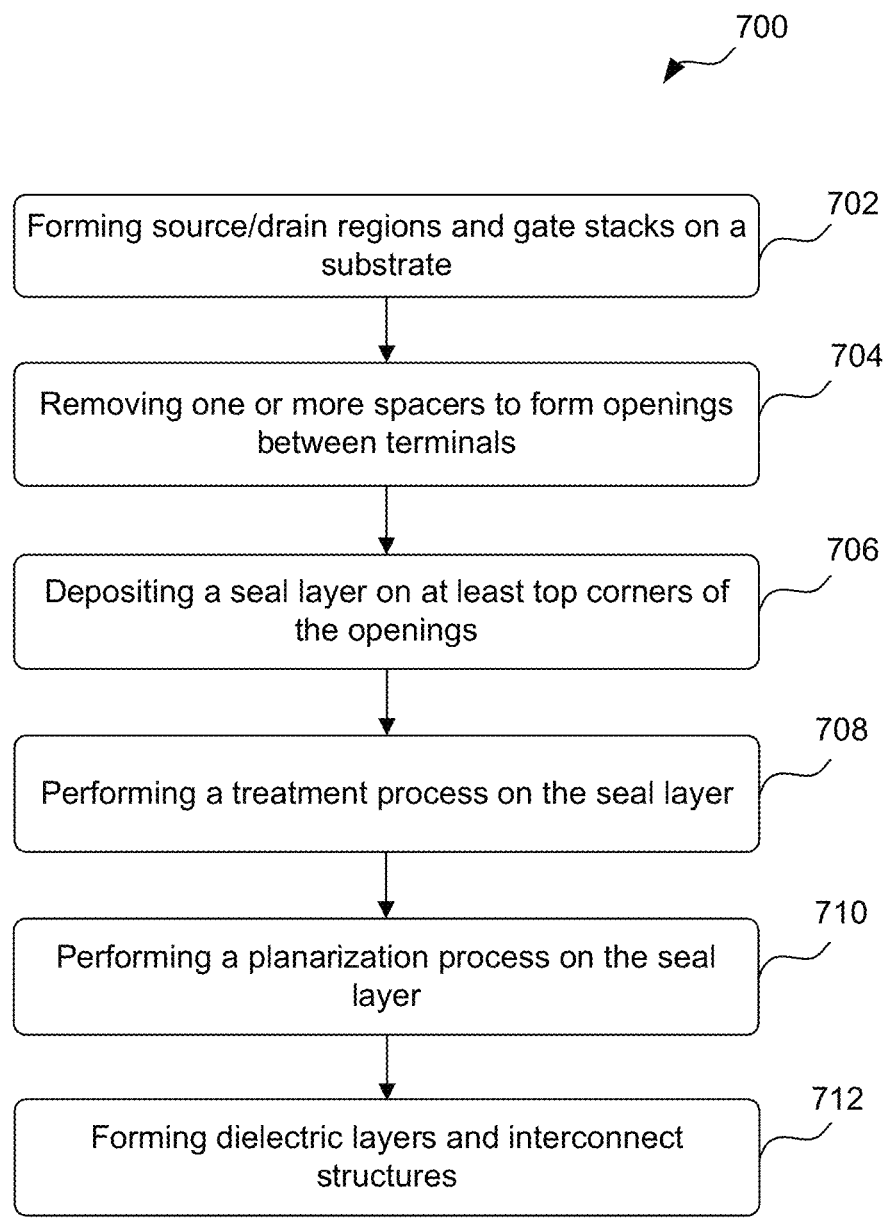
FIG. 7 is a flow diagram of a method of forming bilayer seal structures in semiconductor structures, in accordance with some embodiments.

FIGS. 2-6 provide various exemplary semiconductor structures and fabrication processes that illustrate the formation of spacer structures having air gaps and highly rigid seal layers, in accordance with some embodiments. The highly rigid seal layers can also be free of seams. FIG. 7 is a flow diagram of a method 700 of forming air gaps and highly rigid seal layers in semiconductor structures, in accordance with some embodiments of the present disclosure. Based on the disclosure herein, other operations in method 700 can be performed. Further, the operations of method 700 can be performed in a different order and/or vary.

The air gaps with seamless seal layers can provide the benefit of reducing and/or eliminating damage to the air gaps formed between spacer structures. The fabrication processes can be used to form planar semiconductor devices or vertical semiconductor devices, such as finFETs. In some embodiments, the fabrication processes illustrated in FIGS. 2-7 can be used to form semiconductor structures similar to finFET structures described above in FIG. 1. For example, the semiconductor structures illustrated in FIGS. 2-7 can be similar to finFET 100 during different stages of fabrication as viewed from the cut A-A' illustrated in FIG. 1.

Figure 2:
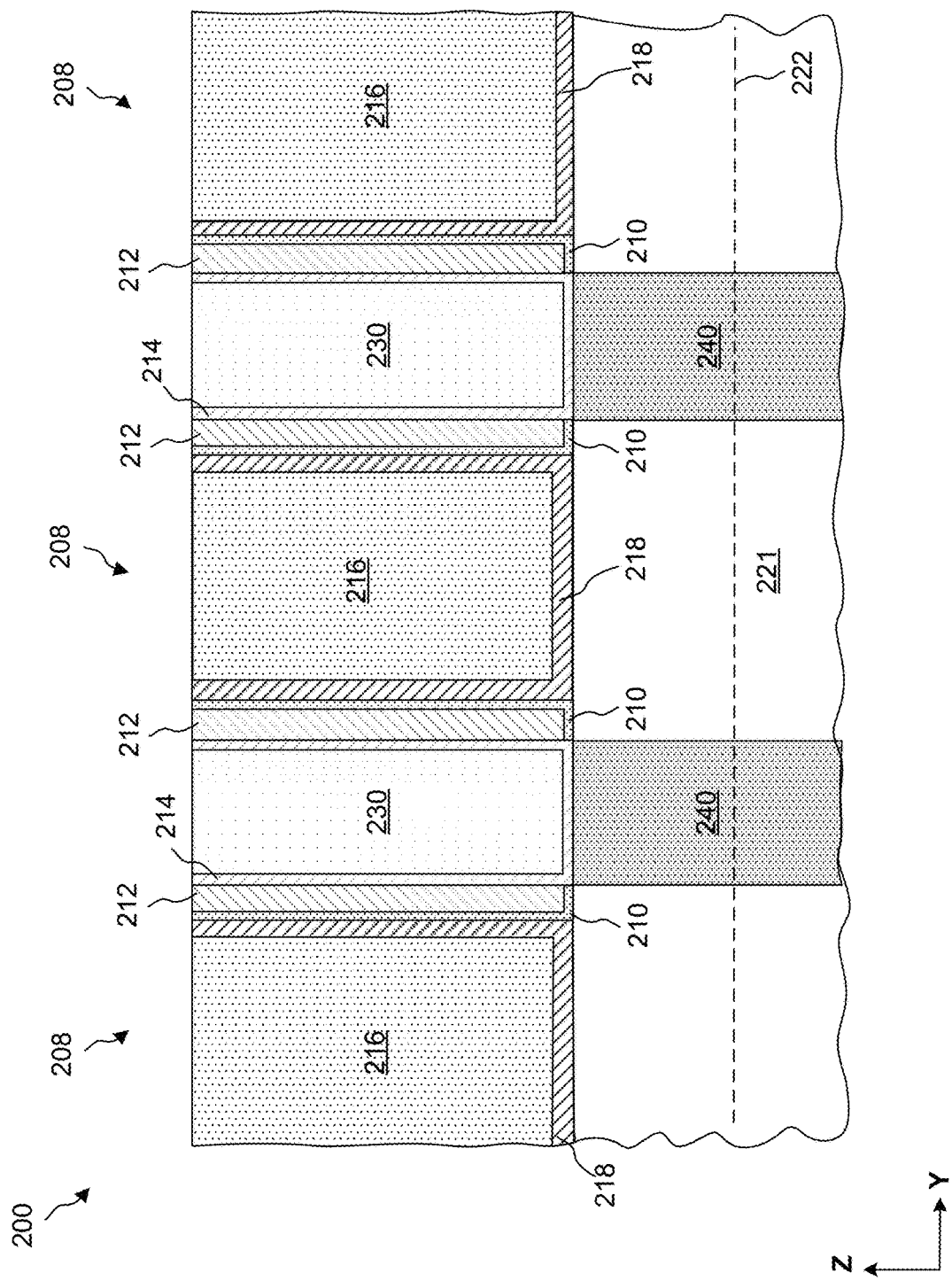
FIGS. 2-6 are cross-sectional views of various partially-formed semiconductor structures, in accordance with some embodiments.

Referring to operation 702 of FIG. 7, source/drain regions and gate stacks are formed on a substrate, according to some embodiments. FIG. 2 is a cross-sectional view of a semiconductor structure 200 after three neighboring gate structures 208 and two source/drain contacts 230 are formed over a substrate. The substrate can include fin region 221. Each gate stack such as gate structure 208 includes a gate dielectric layer 218 and a gate electrode 216. Gate dielectric layer 218 can be formed on sidewalls and bottom surfaces of gate electrode 216. Channel regions for semiconductor devices, such as finFETs, can be formed in fin region 221 and under gate structures 208.

Fin region 221 can be current-carrying semiconductor structures formed on the substrate. For example, fin region 221 can be similar to fin region 121 described above in FIG. 1. In some embodiments, fin region 221 can include a semiconductor material, such as germanium, silicon, silicon carbide, gallium arsenide, gallium phosphide, indium phosphide, indium arsenide, indium antimonite, silicon germanium carbide, silicon germanium, gallium arsenic phosphide, gallium indium phosphide, gallium indium arsenide, gallium indium arsenic phosphide, aluminum indium arsenide, aluminum gallium arsenide, any suitable material, and combinations thereof. In some embodiments, fin region 221 can be doped with p-type or n-type dopants.

Gate dielectric layer 218 can be formed on fin region 221 and formed using a high-k dielectric material. Gate dielectric layer 218 can deposited by CVD, ALD, PVD, e-beam evaporation, or other suitable processes. In some embodiments, gate dielectric layer 218 can include a high-k dielectric material, such as $HfO_2$. In some embodiments, gate dielectric layer 218 can include $TiO_2$, HfZrO, $Ta_2O_3$, $HfSiO_4$, $ZrO_2$, and $ZrSiO_2$. In some embodiments, gate dielectric layer 218 can be similar to dielectric layer 118 described above in FIG. 1.

Gate electrode 216 can be formed on gate dielectric layer 218 and can include a single metal layer or a stack of metal layers. Gate structures 208 can further include work function layers and are not illustrated in FIG. 2 for simplicity. The stack of metal layers can include metals having work functions similar to or different from each other. In some embodiments, gate electrode 216 can be formed of a conductive material, such as Al, Cu, W, Ti, Ta, TiN, TaN, NiSi, CoSi, Ag, TaC, TaSiN, TaCN, TiAl, TiAlN, WN, metal alloys, and combinations thereof. Gate electrode 216 can be formed using a suitable deposition process, such as ALD, CVD, PVD, plating, and combinations thereof. Other materials and formation methods for gate electrode 216 are within the scope of this disclosure. In some embodiments, gate electrode 216 can be formed using a gate replacement process, where a polysilicon gate is removed and a metal gate electrode is formed in the place of the removed polysilicon gate.

Spacer structures can be formed on sidewalls of gate structures 208. In some embodiments, gate structures can include a gate electrode, dielectric layers, spacers, any other suitable structures, and are collectively referred to as gate structures for ease of reference. In some embodiments, spacers 210 and 212 can be formed on sidewalls of gate dielectric layer 218 and on top surfaces of fin region 221. Spacer structures are formed on sidewalls of gate electrode 216 to protect gate dielectric layer 218 and gate electrode 216 during subsequent processing. In some embodiments, spacer 210 can have an L-shaped cross section with a vertical portion formed on the sidewall of gate dielectric layer 218 and a horizontal portion formed on the top surface of fin region 221. In some embodiments, spacer 210 is only formed on the sidewall of gate dielectric layer 218. Spacer 210 can be formed using a dielectric material, such as silicon carbide nitride, silicon nitride, silicon oxide, any suitable dielectric material, and combinations thereof. In some embodiments, the carbon atomic content can be less than about 30% for spacer 210 formed using silicon carbide nitride. In some embodiments, the carbon atomic content of spacer 210 can be between about 20% and about 30%. Additional spacers, such as spacer 212, can also be formed. For example, spacer 212 can be formed on the horizontal portion of spacer 210, on the top surface of fin region 221, or both. In some embodiments, spacer 212 can be formed using a dielectric material, such as silicon. In some embodiments, the materials that form spacers 210 and 212 can have high etch selectivity (e.g., greater than about 10) such that when spacer 212 is removed spacer 210 can remain substantially intact. In some embodiments, spacers 210 and 212 can be formed using any suitable dielectric material, such as silicon nitride, silicon oxynitride, silicon carbide, silicon oxycarbide, silicon on glass (SOG), tetraethoxysilane (TEOS), PE-oxide, HARP formed oxide, and combinations thereof. In some embodiments, spacers 210 and 212 can be formed using a low-k dielectric material.

Source/drain (S/D) regions 240 can be formed in fin region 221. S/D regions 240 can be p-type regions or n-type regions. In some embodiments, p-type S/D regions 240 can include SiGe and can be in-situ doped during an epitaxial growth process using p-type dopants, such as boron, indium, and gallium. For p-type in-situ doping, p-type doping precursors, such as $B_2H_6$, $BF_3$, and other p-type doping precursors, can be used. In some embodiments, n-type S/D regions 240 can include Si and can be in-situ doped during an epitaxial growth process using n-type dopants, such as phosphorus and arsenic. For n-type in-situ doping, n-type doping precursors, such as $PH_3$, $AsH_3$, and other n-type doping precursors, can be used. In some embodiments, S/D regions 240 are not in-situ doped, and an ion implantation process is performed to dope S/D regions 240. In some embodiments, S/D regions can be similar to S/D regions 160 described above in FIG. 1.

Source/drain (S/D) contacts 230 can be in physical and electrical contact with source/drain regions 240. S/D contacts 230 can be formed by depositing a conductive material between adjacent gate structures 208. For example, openings can be formed between spacers 212 to expose underlying S/D regions 240. A deposition process can be performed to deposit the conductive material in the openings such that electrical connections can be made. In some embodiments, a contact etch stop layer (CESL) 214 can be deposited in the opening prior to the deposition of the conductive materials. Examples of the conductive material deposition process can include PVD, sputtering, electroplating, electroless plating, any suitable deposition process, and combinations thereof. A planarization process can be performed after the deposition process such that top surfaces of gate electrode 216, spacers 210 and 212, CESL 214, and source/drain contacts 230 can be substantially coplanar (e.g., an even surface). In some embodiments, S/D contacts 230 can be formed using tungsten, aluminum, cobalt, silver, any suitable conductive material, and combinations thereof.

Similar to finFET 100 described in FIG. 1, semiconductor structure 200 can be formed on a substrate where fin regions 221 protrude from STI regions. The STI regions are not visible from the cross-sectional view of semiconductor structure 200 illustrated in FIG. 2, but a top surface of the STI regions is represented by dashed line 222 for ease of description.

Figure 3:
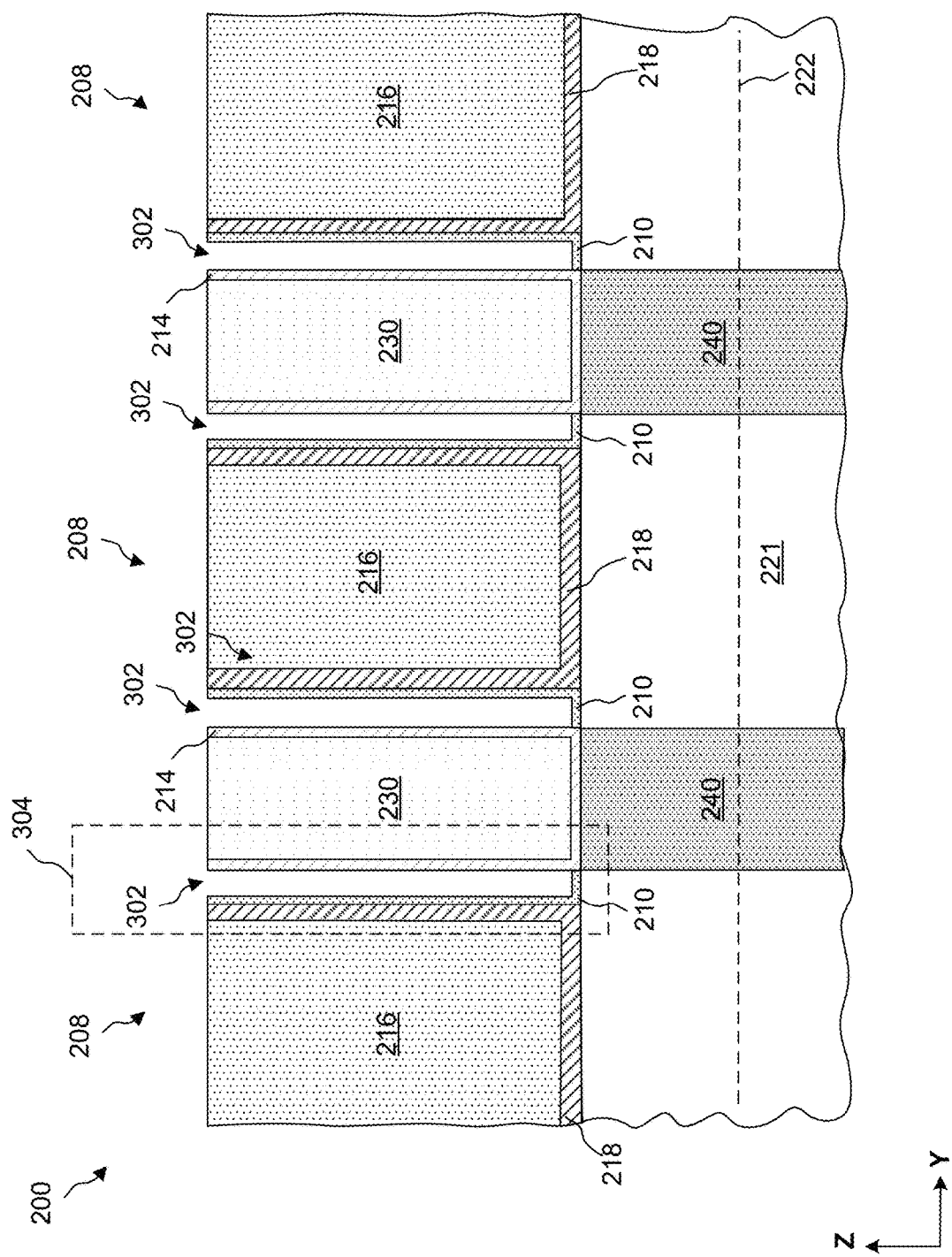

Referring to operation 704 of FIG. 7, one or more spacers are removed to form openings between terminals of the semiconductor device, according to some embodiments. FIG. 3 is a cross-sectional view of the semiconductor device after one or more spacers are removed to form openings. Examples of terminals of a semiconductor device can be a gate structure, a S/D structure, or any other suitable structures. Gate structure 208 shown in FIG. 3 can include gate dielectric layer 218 and gate electrode 216. In some embodiments, gate structure 208 can also include spacer 210. S/D structures can include S/D contact 230 and CESL 214. In some embodiments, S/D structures can further include S/D regions 240 formed in fin region 221. During operation 704, one or more spacers of the spacers between gate electrode 216 and S/D contacts 230 can be removed. For example, spacers 212 can be removed to form openings 302 that is surrounded by spacer 210 and CESL 214. One or more etching processes can be used to remove spacer 212. In some embodiments, an etching process that has high etch selectivity of spacer 212 over other structures in semiconductor structure 200 can be used to remove spacer 212 while keeping the other exposed structures intact. For example, spacers 212 can be formed using silicon carbide nitride, and a wet etching process and/or a plasma etching can be used to selectively remove spacers 212.

Figure 4A:
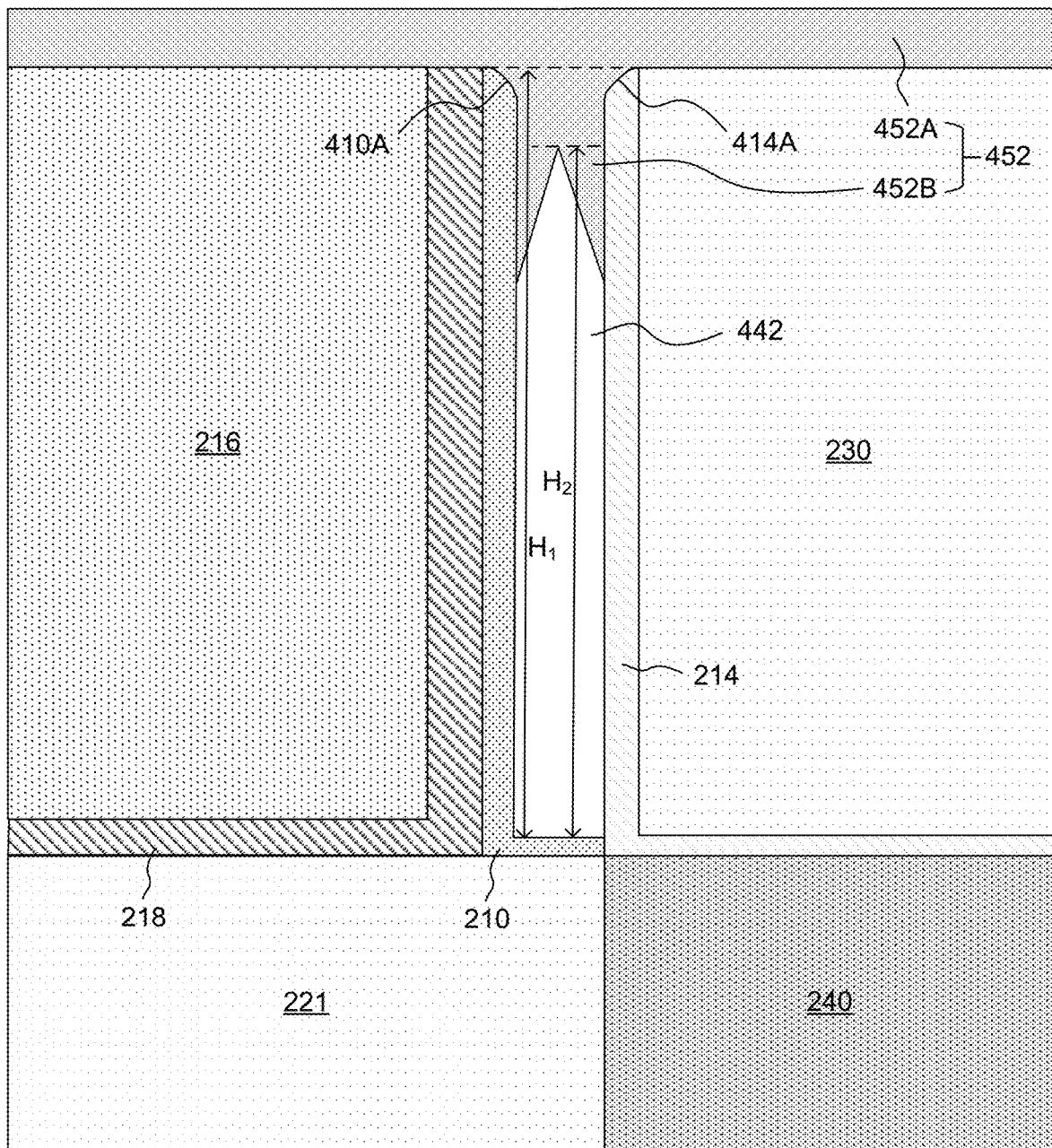
Figure 4B:
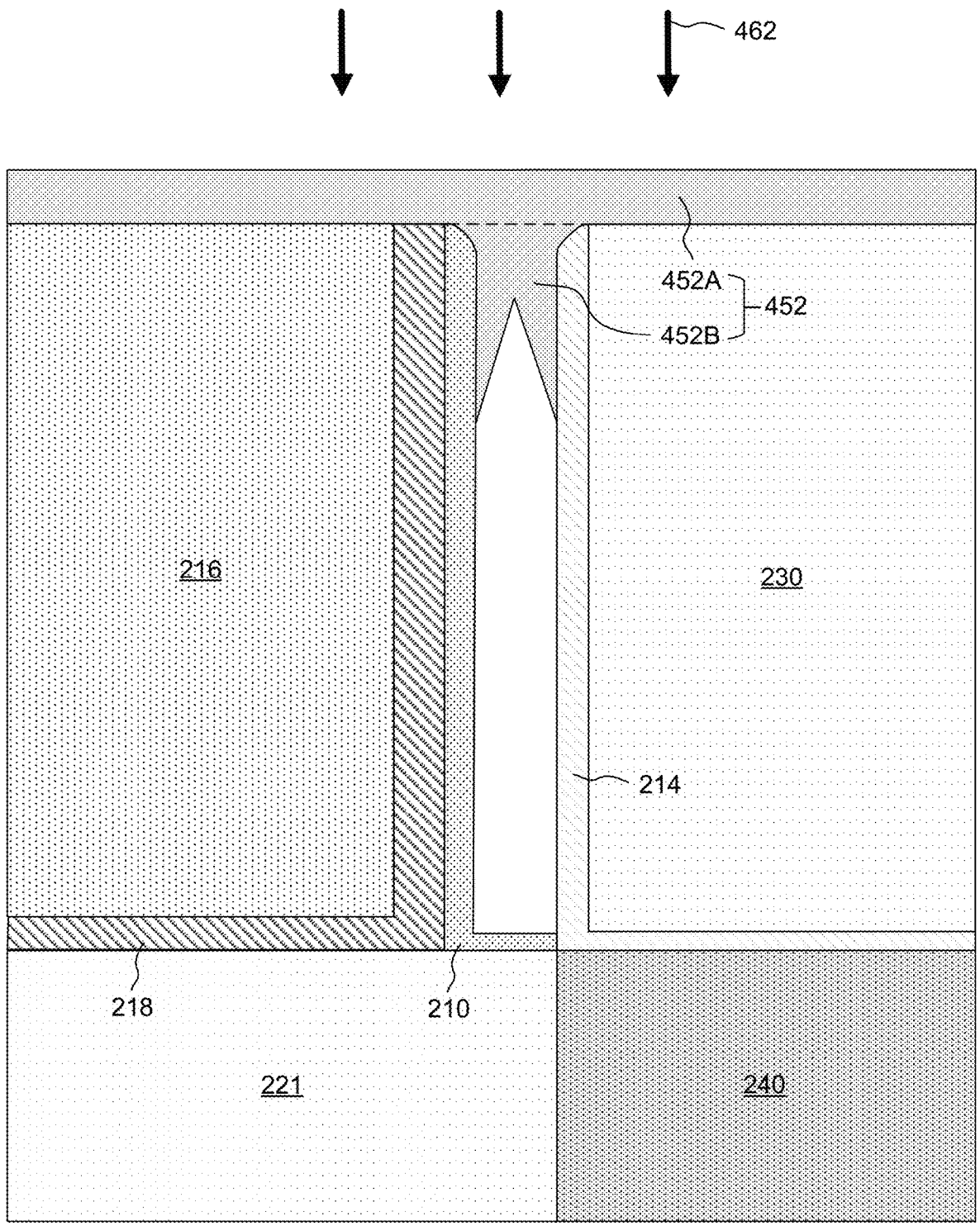

FIGS. 4A and 4B are cross-sectional views illustrating the fabrication processes for forming highly rigid seam layers using a cyclic deposition/treatment process, according to some embodiments. FIGS. 4C-4F are cross-sectional views illustrating highly rigid seal layers formed using a multi-deposition process, according to some embodiments. FIGS. 4A-4F are enlarged views of region 304 of FIG. 3. Other structures can be included in the structures shown in FIGS. 4A-4F and are not illustrated for simplicity.

Referring to operation 706 of FIG. 7, a seal layer is deposited on at least the top corners of openings in the semiconductor device, according to some embodiments. FIG. 4A is a cross-sectional view illustrating the semiconductor device after the seal material is deposited on at least the top corners of an opening in the semiconductor device. Seal layer 452 is deposited on exposed top surfaces of structures in the semiconductor device, such as top surfaces of gate electrode 216, gate dielectric layer 218, S/D contacts 230, CESL 214, and other structures. In some embodiments, seal layer 452 can also be deposited in opening 302. For example, seal layer 452 can be deposited on sidewalls of spacer 210 and CESL 214. In some embodiments, seal layer 452 can be deposited on the bottom of opening 302, such as on the top surface of the horizontal portion of spacer 210 formed on fin region 221. In some embodiments, seal layer 452 can also be formed on fin region 221 if a portion of the top surface of fin region 221 is exposed between spacer 210 and CESL 214. Seal layer 452 can have horizontal portions 452A formed on the top surfaces of gate electrode 216, gate dielectric layer 218, and S/D contacts 230 to protect these semiconductor structures from subsequent fabrication processes. For example, horizontal portions 452A can prevent oxidation of underlying materials during subsequent etching or treatment processes. Seal layer 452 can also include a corner portion 452B formed on spacer 210 and CESL 214. Top surfaces of spacer 210 and CESL 214 can respectively have rounded corners 410A and 414A to facilitate the growth of corner portion 452B of seal layer 452. The curved surfaces of rounded corners 410A and 414A can reduce the formation of voids or discontinuations in seal layer 452 compared to corners having right angles or sharp edges. Corner portions 452B of seal layer 452 can contour the curved surfaces of rounded corners 410A and 414A.

Seal layer 452 can affect the volume of subsequently formed air gaps between terminals of a semiconductor device, such as gate electrode 216 and S/D contacts 230, by adjusting the depth of seal layer 452 that extends into opening 302. Specifically, corner portions 452B of seal layer 452 can extend into opening 302 by forming on sidewalls of spacers 210 and CESL 214. Openings 302 can have depth $H_1$ and a high aspect ratio (e.g., aspect ratio greater than about 10). A greater height $H_2$ of air gap 442 can be achieved by reducing the extension of corner portions 452B into opening 302. A greater value of the ratio of $H_2$ to $H_1$ can indicate a greater volume of air gaps 442 in opening 302. In some embodiments, opening 302 has a height $H_1$ that can be between about 10 nm and about 60 nm. For example, height $H_1$ can be between about 15 nm and about 55 nm, between about 20 nm and about 50 nm, or any suitable height values. In some embodiments, air gap height $H_2$ can be between about 5 nm and about 55 nm. For example, height $H_2$ can be between about 7 nm and about 50 nm, between about 10 nm and about 45 nm, or any suitable height values. In some embodiments, the ratio of $H_1$ to $H_2$ can be between about 0.9 and about 2.2. For example, the ratio can be between about 1 and about 2.1, between about 1.05 and about 2, or any suitable ratios.

Seal layer 452 can be formed using any suitable dielectric material. In some embodiments, seal layer 452 can be formed using material that provides sufficient mechanical strength to support the air gap structure and chemical resistance to protect from subsequent chemical processes. In some embodiments, seal layer 452 can include silicon-oxygen or silicon-carbon cross-links. For example, seal layer 452 can be formed using a highly rigid silicon carbide material doped with oxygen. In some embodiments, seal layer 452 can be formed using a silicon carbide material. In some embodiments, seal layer 452 can be deposited using radical CVD, CVD, ALD, LPCVD, UHVCVD, RPCVD, PVD, any other suitable deposition processes, and combinations thereof. In some embodiments, seal layer 452 can be deposited using a radical CVD process with an ion filter. In some embodiments, the deposition of seal layer 452 can include a first operation of flowing precursors into a deposition chamber. The precursors can provide one or more of the following bonding types: silicon-oxygen, silicon-hydrogen, and silicon-carbon. In some embodiments, the precursors are in gas phase and can include, for example, tetramethyldisiloxane (TSMDSO), hydrogen gas, and oxygen gas. Other suitable precursors can also be included. The flow ratio of hydrogen gas to oxygen gas can be greater than about 20 to minimize the oxidation of underlying materials while facilitating the chemical reactions needed for the deposition. For example, the flow ratio of hydrogen gas to oxygen gas can be between about 20 and about 30. The deposition can further include a second operation that includes activating plasma and used to activate the precursors in their gas phase to form silicon-oxygen and silicon-carbon cross-links as they are deposited on the exposed surfaces. The seal material of seal layer 452 deposited on opposing corners 410A and 414A would gradually accumulate and eventually merge to seal opening 302 such that air gap 442 is physically isolated from the environment above seal layer 452. Air gap 442 would be surrounded by and in physical contact with seal layer 452, spacer 210, and CESL 214. In some embodiments, spacer 210 is formed only on the sidewall of gate dielectric layer 218, and air gap 442 can be in physical contact with fin region 221.

The height $H_2$ of air gaps 442 can be adjusted through changes in various deposition parameters of seal layer 452. For example, reducing the deposition rate of seal layer 452 can increase accumulation of seal material on sidewalls further into opening 302 towards its bottom that can result in a lower height $H_2$ of air gaps 442 (e.g., smaller air gap 442). In some embodiments, the deposition rate can be between about 1 Å/min and about 100 Å/min. In some embodiments, the deposition process can be performed at a deposition rate greater than about 25 Å/min. For example, the deposition process can be performed at a rate between about 25 Å/min and about 35 Å/min. In some embodiments, the deposition rate can be between about 55 Å/min and about 65 Å/min. For example, the deposition rate can be about 60 Å/min. The deposition rate can be adjusted through various deposition parameters. In some embodiments, a lower chamber pressure during deposition or greater plasma power can provide a greater deposition rate. In some embodiments, chamber pressure can be between about 0.5 Torr and about 12 Torr. For example, chamber pressure can be between 0.5 Torr and about 3 Torr, between about 3 Torr and about 7 Torr, between about 7 Torr and about 12 Torr, and any other suitable ranges or values. As another example, a chamber pressure between about 4.5 Torr and about 5.5 Torr can provide deposition rate of about 35 Å/min while a chamber pressure between about 6 Torr and about 7 Torr can provide a lower deposition rate at about 20 Å/min.

The plasma power level of the deposition process can also affect the deposition rate. For example, a greater plasma power level during a CVD process can provide a greater deposition rate. In some embodiments, the plasma power level can be between about 500 W and about 3000 W. For example, the plasma power level can be between about 500 W and about 1000 W, between about 1000 W and about 2000 W, between about 2000 W and about 3000 W, and at any other suitable power levels. In some embodiments, the deposition process can use radical triggered chemical reaction with an ion filer.

The density of seal layer 452 can also be adjusted through deposition parameters. Increasing the density of seal layer 452 can provide for greater mechanical support and improved chemical resistance. In some embodiments, seal layer 452 can have a density greater than about 2.0 $g/cm^3$. For example, the density of seal layer 452 can be between about 2.0 $g/cm^3$ and about 3.2 $g/cm^3$. In some embodiments, the density can be between about 2.2 $g/cm^3$ and about 2.2 $g/cm^3$. In some embodiments, a greater density can be achieved through lower chamber processing pressure and greater plasma power level. In some embodiments, the chamber processing pressure can be between about 0.5 Torr and about 12 Torr. For example, the chamber processing pressure can be between about 0.5 Torr and about 3 Torr, between about 3 Torr and about 8 Torr, between about 8 Torr and about 12 Torr, and any other suitable ranges or values.

The dielectric constant of seal layer 452 can be less than about 5. In some embodiments, seal layer 452 can have a dielectric constant between about 3.2 and about 5. A lower dielectric constant of seal layer 452 can lead to lower parasitic capacitance of the terminals of semiconductor device 200. In some embodiments, the leakage current in semiconductor structure 200 can be less than about $1 E^{-8}$ $A/cm^2$ at 2 MV/cm.

Referring to operation 708 of FIG. 7, a treatment process is performed on the deposited seal layer, according to some embodiments. FIG. 4B is a cross-sectional view illustrating the semiconductor device after a treatment process is performed.

A treatment process 462 can be performed on the deposited seal layer 452 to adjust the oxygen content of the deposited seal material. In some embodiments, treatment process 462 can increase the oxygen content in the deposited seal material. In some embodiments, treatment process 462 can be performed in an oxygen chamber environment. The oxygen environment facilitates additional Si—O—Si cross-links to be formed in the seal material, effectively doping the seal material with additional oxygen atoms. In some embodiments, treatment process 462 can reduce the oxygen content. In some embodiments, treatment process 462 can be performed in a hydrogen chamber environment. In some embodiments, a treatment chamber can contain hydrogen gas at a preset pressure. The hydrogen environment facilitates the removal of oxygen atoms from the deposited seal material such that more Si—C—Si cross-links are formed. In some embodiments, the silicon atomic content of seal layer 452 can be between about 25% and about 35%. In some embodiments, the oxygen atomic content of seal layer 452 can be between about 30% and about 55%. In some embodiments, the carbon atomic content of seal layer 452 can be between about 10% and about 35%.

The deposition/treatment process described with reference to FIGS. 4A and 4B are exemplary. In some embodiments, the deposition/treatment process can be performed in cycles until the nominal property of the deposited seal layer has been achieved. For example, a cycle including at least one deposition operation and at least one treatment process can be performed more than once until a nominal thickness or quality of seal layer 452 has been achieved. In some embodiments, the cycle can be performed once. In some embodiments, the treatment process can be performed in chamber environments filled with any suitable type of gas, such as argon, nitrogen, and any suitable gas. In some embodiments, the deposition and/or treatment process can be performed at a temperature between about 200° C. and about 700° C. For example, the deposition temperature can be between about 200° C. and about 500° C., between about 500° C. and about 700° C., and at any suitable temperature.

Figure 4C:
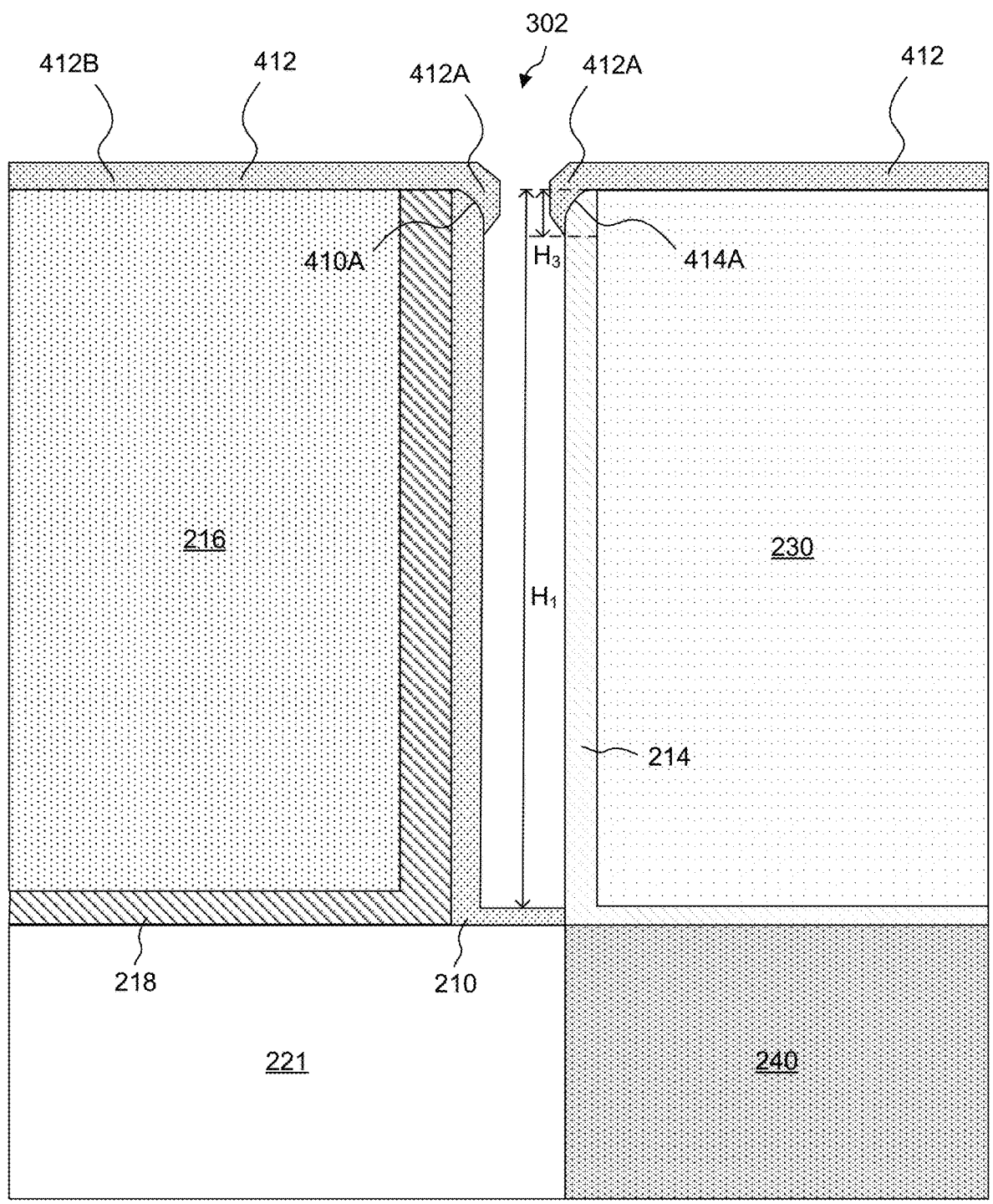

In some embodiments, seal layer 452 can be deposited by a bilayer deposition process as described in FIGS. 4C-4F. As shown in FIG. 4C, a first seal material is deposited on at least corners of openings in the semiconductor device, according to some embodiments. First seal material 412 is deposited on top surfaces of gate electrode 216, gate dielectric layer 218, S/D contacts 230, and CESL 214. In some embodiments, first seal material 412 can also be deposited in opening 302. For example, first seal material 412 can be deposited on sidewalls of spacer 210 and CESL 214. In some embodiments, first seal material 412 can be deposited on the bottom of opening 302, such as on the top surface of the horizontal portion of spacer 210 formed on fin region 221. In some embodiments, first seal material 412 can also be formed on fin region 221 if a portion of the top surface of fin region 221 is exposed between spacer 210 and CESL 214. First seal material 412 can include a corner portion 412A formed on spacer 210 and CESL 214. Top surfaces of spacer 210 and CESL 214 can respectively have rounded corners 410A and 414A to facilitate the growth of corner portion 412A of first seal material 412. The curved surfaces of rounded corners 410A and 414A can reduce the formation of voids or discontinuations in first seal material 412 compared to corners having right angles or sharp edges. Corner portions 412A of first seal material 412 can contour the curved surfaces of rounded corners 410A and 414A. First seal material can have horizontal portions 412B formed on the top surfaces of gate electrode 216, gate dielectric layer 218, and S/D contacts 230 to protect them from subsequent fabrication processes. For example, horizontal portions 412B can prevent oxidation of underlying materials during subsequent etching or treatment processes.

First seal material 412 can affect the volume of subsequently formed air gaps between gate electrode 216 and S/D contacts 230 by adjusting the depth of first seal material 412 that extends into opening 302. Specifically, corner portions 412A of first seal material 412 can extend into opening 302 by forming on sidewalls of spacers 210 and CESL 214. A greater extension depth $H_3$ of corner portions 412A into opening 302 can provide a smaller subsequently formed air gap (not shown in FIG. 4C) in opening 302. For example, a greater value of the ratio of $H_3$ to $H_1$ can leave less volume in opening 302 for air gaps to be formed. In some embodiments, opening 302 has a height $H_1$ that can be between about 10 nm and about 60 nm. For example, height $H_1$ can be between about 15 nm and about 55 nm, between about 20 nm and about 50 nm, or any suitable height values. In some embodiments, extension depth $H_3$ can be between about 2 nm and about 11 nm. For example, depth $H_3$ can be between about 5 nm and about 9 nm.

First seal material 412 can be formed using any suitable dielectric material. In some embodiments, first seal material 412 can be formed using a material that provides sufficient mechanical strength to support the air gap structure and chemical resistance to protect from subsequent chemical processes. In some embodiments, first seal material 412 can include silicon-oxygen or silicon-carbon cross-links. For example, first seal material 412 can be formed using a highly rigid silicon carbide material doped with oxygen. In some embodiments, first seal material 412 can be formed using a silicon carbide material. In some embodiments, first seal material 412 can be deposited using radical CVD, CVD, ALD, LPCVD, UHVCVD, RPCVD, PVD, any other suitable deposition processes, and combinations thereof. In some embodiments, first seal material 412 can be deposited using a radical CVD process with an ion filter. In some embodiments, the deposition of first seal material 412 can include a first operation of flowing precursors into a deposition chamber. The precursors can provide one or more of the following bonding types: silicon-oxygen, silicon-hydrogen, and silicon-carbon. In some embodiments, the precursors are in gas phase and can include, for example, tetramethyldisiloxane (TSMDSO), hydrogen gas, and oxygen gas. Other suitable precursors can also be included. The flow ratio of hydrogen gas to oxygen gas can be greater than about 20 to minimize the oxidation of underlying materials while facilitating the chemical reactions needed for the deposition. For example, the flow ratio of hydrogen gas to oxygen gas can be between about 20 and about 30. The deposition can further include a second operation that includes activating plasma and used to activate the precursors in their gas phase to form silicon-oxygen and silicon-carbon cross-links. The deposition process can include a third operation of a treatment process to reduce the oxygen content from the deposited seal material. The treatment process can be performed in a hydrogen chamber environment. In some embodiments, the treatment process can be performed in chamber environments having any suitable type of gas, such as argon, nitrogen, and any suitable gas. In some embodiments, the deposition process can be performed at a temperature between about 300° C. and about 700° C. For example, the deposition temperature can be between about 300° C. and about 500° C., between about 500° C. and about 700° C., and at any suitable temperature. In some embodiments, the deposition and treatment process can be performed in cycles, such as a cyclic process deposition-treatment process. For example, the deposition and treatment process can be followed by another deposition and treatment process until a nominal thickness or quality of first seal material has been achieved.

The deposition rate can be adjusted through various deposition parameters. A greater deposition rate can facilitate greater accumulation of first seal material at curved surfaces 410A and 414A. A lower deposition rate can provide a greater extension depth $H_3$ of first seal material 412 into opening 302. A greater deposition rate can be achieved through adjusting various suitable processing parameters. In some embodiments, the deposition process can be performed at a deposition rate greater than about 25 Å/min. For example, the deposition process can be performed at a rate between about 25 Å/min and about 35 Å/min. In some embodiments, the deposition rate can be between about 55 Å/min and about 65 Å/min. For example, the deposition rate can be about 60 Å/min. In some embodiments, a lower chamber pressure during deposition or greater plasma power can provide a greater deposition rate. In some embodiments, the chamber pressure can be between about 0.5 Torr and about 12 Torr. For example, chamber the pressure can be between 0.5 Torr and about 3 Torr, between about 3 Torr and about 7 Torr, between about 7 Torr and about 12 Torr, and any other suitable ranges or values. As another example, a chamber pressure between about 4.5 Torr and about 5.5 Torr can provide deposition rate of about 35 Å/min, while a chamber pressure between about 6 Torr and about 7 Torr can provide a lower deposition rate at about 20 Å/min.

The plasma power level for the deposition can also affect the deposition rate. A greater plasma power level can provide a greater deposition rate. In some embodiments, the plasma power level can be between about 500 W and about 3000 W. For example, the plasma power level can be between about 500 W and about 1000 W, between about 1000 W and about 2000 W, between about 2000 W and about 3000 W, and at any other suitable power levels.

The density of first seal material 412 can also be adjusted through deposition parameters. Increasing the density of seal material 412 can provide for greater mechanical support and improved chemical resistance. In some embodiments, first seal material 412 can have a density greater than about 2.0 g/cm$^3$. For example, the density of first seal material 412 can be between about 2.0 g/cm$^3$ and about 2.2 g/cm$^3$. In some embodiments, the density can be between about 2.2 g/cm$^3$ and about 3.2 g/cm$^3$. In some embodiments, a greater density can be achieved through a lower chamber processing pressure and a greater plasma power level. In some embodiments, the chamber processing pressure can be between about 0.5 Torr and about 12 Torr. For example, the chamber processing pressure can be between about 0.5 Torr and about 3 Torr, between about 3 Torr and about 8 Torr, between about 8 Torr and about 12 Torr, and any other suitable ranges or values. In some embodiments, the plasma power level can be between about 500 W and about 3000 W. For example, the plasma power level can be between about 500 W and about 2000 W, between about 2000 W and about 3000 W, and any other suitable ranges or values. In some embodiments, the deposition process can use radical triggered chemical reaction with an ion filer.

The dielectric constant of first seal material 412 can be less than about 5. In some embodiments, first seal material 412 can have a dielectric constant between about 3.2 and about 5. A lower dielectric constant of first seal material 412 can lead to lower parasitic capacitance of the terminals of semiconductor device 200. In some embodiments, the leakage current in semiconductor structure 200 can be less than about 1 $E^{-8}$ A/cm$^2$ at 2 MV/cm.

An optional treatment process can be performed on first seal material 412 to further increase the amount of its internal crosslinks and/or improve its density. For example, a hydrogen anneal process can be performed to reduce the oxygen content and can form additional Si—C—Si bonds in first seal material 412. The hydrogen treatment process can also remove chemical byproducts, such as $H_2O$. In some embodiments, the optional treatment process can be performed for less than about 1 min. For example, the treatment process can be performed for between about 40 s and about 1 min.

Figure 4D:
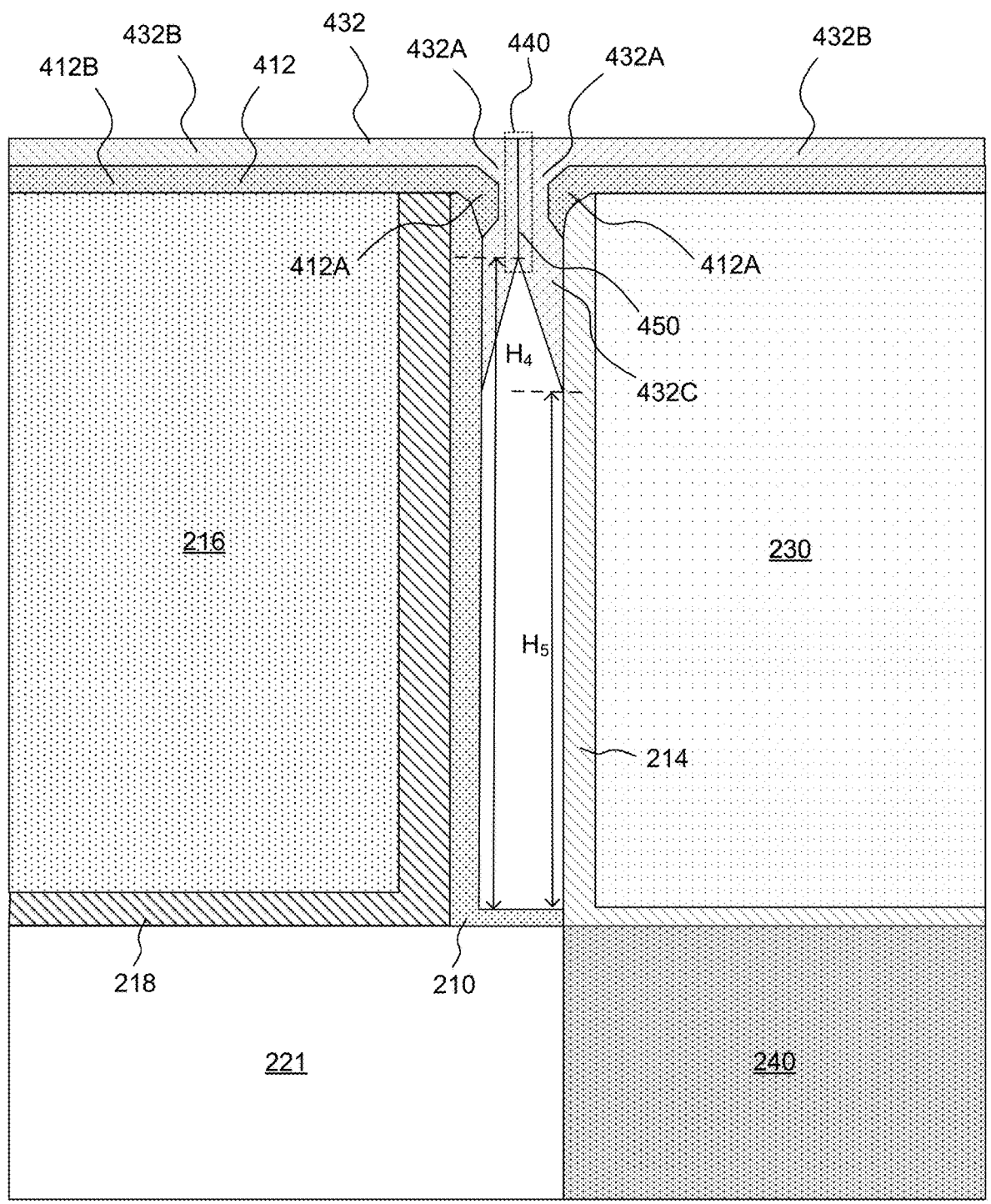

A second seal material can be deposited on the first seal material and in the openings, according to some embodiments. FIG. 4D is a cross-sectional view illustrating the semiconductor device after the second seal material is deposited. Second seal material 432 is deposited on portions of surfaces of first seal material 412, spacer 210, and CESL 214. Second seal material 432 can include at least: (i) corner portions 432A deposited on corner portions 412A of first seal material 412; (ii) horizontal portion 432B deposited on 412B of first seal material 412, and (iii) vertical portions 432C deposited on sidewalls of spacer 210 and CESL 214. In some embodiments, second seal material 432 can be deposited on the bottom of opening 302, such as on the top surface of the horizontal portion of spacer 210 formed on fin region 221.

Second seal material 432 can be deposited using any suitable deposition process. For example, second seal material 432 can be deposited using a CVD process. Semiconductor structure 200 can be loaded into a deposition chamber and a seal material is subsequently blanket deposited. As precursors in the deposition chamber have to move through the opening formed between opposing corner portions 412A of first seal material 412 to be deposited on exposed surfaces of opening 302, the precursors have lower probabilities to come into contact with surfaces of spacers 210 and CESL 214 compared to the top surfaces of horizontal portions 412B. Accordingly, the seal material is deposited at a lower rate in opening 302 that is below corner portions 412A. As the seal material gradually accumulates on opposing corner portions 412A of first seal material 412 to form corner portions 432A of second seal material 432, corner portion 432A being deposited over one corner portion 412A would merge at region 440 with another corner portion 432A deposited over an opposing corner portion 412A. At region 440, a seam 450 is formed between the adjacent corner portions 432A of second seal material 432.

Second seal material 432 can affect the volume of subsequently formed air gaps between gate electrode 216 and S/D contacts 230 by adjusting the depth of second seal material 432 that extends into opening 302. Specifically, vertical portions 432C of second seal material 432 can extend into opening 302 by forming on sidewalls of spacers 210 and CESL 214. A distance $H_4$ between the lower end of seam 450 and the bottom surface of opening 302 can be between about 10 nm and about 55 nm. For example, height $H_4$ can be between about 12 nm and about 50 nm, between about 15 nm and about 45 nm, or any suitable height values. A greater depth $H_4$ can provide a greater air gap 442 formed between gate electrode 216 and S/D contacts 230. A distance $H_5$ between the lower end of vertical portion 432C and the bottom surface of opening 302 can be less than about 45 nm. For example, distance $H_5$ can be between about 10 nm and about 40 nm, between about 15 nm and about 35, or any suitable distances. In some embodiments, vertical portion 432C can extend to the bottom of opening 302 and be in contact with the top surface of the horizontal portion of spacer 210.

Second seal material 432 can be formed using any suitable dielectric material. In some embodiments, second seal material 432 can be formed using material that provides sufficient bonding strength to first seal material 412. In some embodiments, second seal material 432 can include silicon-oxygen or silicon-carbon cross-links. For example, second seal material 432 can be formed using a highly rigid silicon carbide material doped with oxygen. In some embodiments, second seal material 432 can be formed using a silicon carbide material. In some embodiments, second seal material 432 can be deposited using radical CVD, CVD, ALD, LPCVD, UHVCVD, RPCVD, PVD, any other suitable deposition processes, and combinations thereof. In some embodiments, second seal material 432 can be deposited using a radical CVD process with an ion filter. In some embodiments, the deposition of second seal material 432 can be similar to the deposition process of first seal material 412. In some embodiments, second seal material 432 can be formed by a CVD process using precursors that include, for example, tetramethyldisiloxane (TSMDSO), hydrogen gas, and oxygen gas. Other suitable precursors can also be used. The flow ratio of hydrogen gas to oxygen gas can be greater than about 20 to minimize the oxidation of underlying materials while facilitating the chemical reactions needed for the deposition. For example, the flow ratio of hydrogen gas to oxygen gas can be between about 20 and about 30. The deposition can further include a second operation that includes activating plasma and used to activate the precursors in their gas phase to form silicon-oxygen and silicon-carbon cross-links. In some embodiments, the deposition process can be performed at a temperature between about 300° C. and about 700° C. For example, the deposition temperature can be between about 300° C. and about 450° C., between about 450° C. and about 700° C., and at any other suitable temperatures.

The deposition rate can be adjusted through various deposition parameters. Second seal material 432 can be deposited at a lower deposition rate than first seal material 412. In some embodiments, second seal material 432 can be a substantially conformal film deposition over corner portions 412A and horizontal portion 412B of first seal material 412. A greater deposition rate can facilitate greater accumulation of second seal material at corner portions 412A. A lower deposition rate can provide a greater extension of second seal material 432 into opening 302. A greater deposition rate can be achieved through adjusting various suitable processing parameters. In some embodiments, the deposition process can be performed at a deposition rate less than about 30 Å/min. For example, the deposition process can be performed at a rate between about 20 Å/min and about 30 Å/min. In some embodiments, a lower chamber pressure during deposition or greater plasma power can provide a greater deposition rate. In some embodiments, the chamber pressure can be between about 0.5 Torr and about 12 Torr. For example, the chamber pressure can be between 0.5 Torr and about 3 Torr, between about 3 Torr and about 7 Torr, between about 7 Torr and about 12 Torr, and any other suitable ranges or values.

The plasma power level for the deposition can also affect the deposition rate. A greater plasma power level can provide a greater deposition rate. In some embodiments, the plasma power level can be between about 500 W and about 3000 W. For example, the plasma power level can be between about 500 W and about 1000 W, between about 1000 W and about 2000 W, between about 2000 W and about 3000 W, and at any other suitable power levels.

The density of second seal material 432 can also be adjusted through deposition parameters. Increasing the density of second seal material 432 can provide for greater mechanical support and improved chemical resistance. In some embodiments, second seal material 432 can have a density greater than about 2.0 $g/cm^3$. For example, the density of second seal material 432 can be between about 2.0 $g/cm^3$ and about 2.2 $g/cm^3$. In some embodiments, the density can be between about 2.2 $g/cm^3$ and about 3.2 $g/cm^3$. In some embodiments, a greater density can be achieved through a lower chamber processing pressure and a greater plasma power level. In some embodiments, the chamber processing pressure can be between about 0.5 Torr and about 12 Torr. For example, the chamber processing pressure can be between about 0.5 Torr and about 3 Torr, between about 3 Torr and about 8 Torr, between about 8 Torr and about 12 Torr, and any other suitable ranges or values. In some embodiments, the plasma power level can be between about 500 W and about 3000 W. For example, the plasma power level can be between about 500 W and about 2000 W, between about 2000 W and about 3000 W, and any other suitable ranges or values. In some embodiments, the deposition process can use radical triggered chemical reaction with an ion filer.

The dielectric constant of second seal material 432 can be the same or different from first seal material 412. For example, second seal material 432 can have a dielectric constant less than about 5. In some embodiments, second seal material 432 can have a dielectric constant between about 3.2 and about 5. In some embodiments, the leakage current in semiconductor structure 200 can be less than about 1 $E^{-8}$ $A/cm^2$ at 2 MV/cm.

Figure 4E:
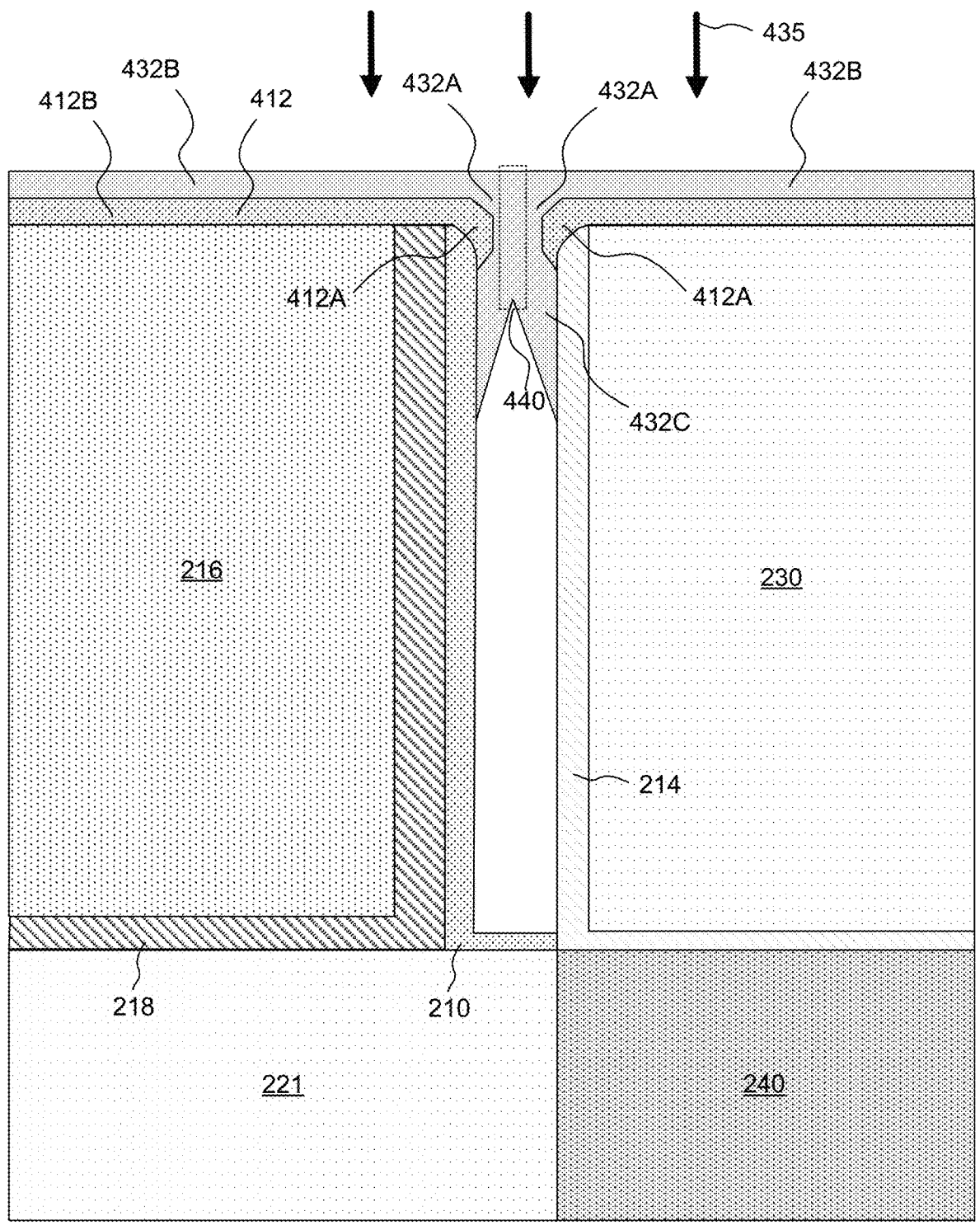

A treatment process can be performed on the first and second seal materials of the seal layer, according to some embodiments. FIG. 4E is a cross-sectional view illustrating the semiconductor device after the treatment process is performed. A treatment process 435 can be performed on second seal material 432 to remove seams, such as seams 450. For example, an oxygen anneal process can be performed such that second seal material 432 physically expands and forms additional bonds at seam 450. During the oxygen anneal process, a portion of the Si—C—Si bonds in second seal material 432 can become Si—O—Si bonds. In some embodiments, the total carbon atomic ratio of second seal material 432 can decrease between about 5% and about 15%. The oxygen treatment process can be performed for less than about 1 min. For example, the treatment process can be performed for between about 40 s and about 1 min. In some embodiments, the oxygen flow rate for treatment process 435 can be between about 1 sccm and about 10 sccm. For example, the oxygen flow rate can be between about 1 sccm and about 3 sccm, between about 3 sccm and about 5 sccm, between about 5 sccm and about 10 sccm, and any other suitable values. The oxygen anneal process can remove any seams such as seams 450 such that region 440 contains second seal material 432 without any seams.

Figure 4F:
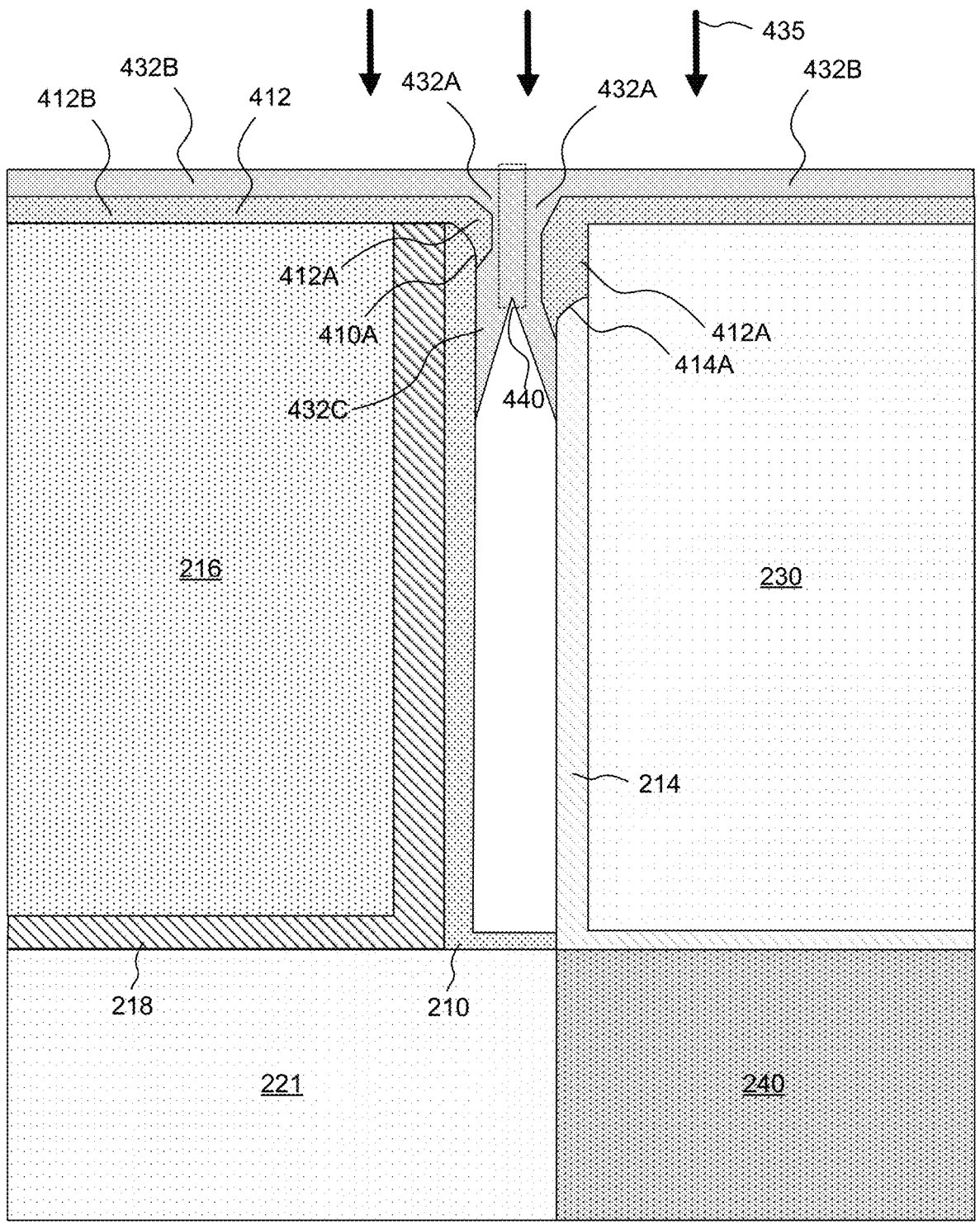

FIG. 4F is a cross-sectional view illustrating a semiconductor device after the treatment process is performed on a seal material that is formed on asymmetrical spacers. As shown in FIG. 4F, spacers 210 and 214 have different heights along sidewalls of gate dielectric layer 218 and S/D contacts, respectively. For example, spacers 210 and 214 can be formed of different materials and an etching rate of spacer 214 can be greater than an etching rate of spacer 210 in response to one or more spacer etch back processes that form curved top corners 410A and 414A. Therefore, corner portion 412A that is formed above spacer 214 can extend lower along sidewall of source/drain contact 230 and towards S/D regions 240 and fin region 221.

Referring to operation 710 of FIG. 7, a planarization process is performed on the highly rigid seal layer, according to some embodiments. FIG. 5 is a cross-sectional view of a semiconductor device after the planarization process is performed. As shown in FIG. 5, highly rigid seal material 532 is formed on semiconductor structure 200, entrapping a pocket of air to form air gaps 542 between terminals of semiconductor structure 200 and a substrate such as fin region 221. In some embodiments, highly rigid seal material 532 is formed of HRSCO. In some embodiments, highly rigid seal material 532 is a seamless seal material. Highly rigid seal material 532 can be formed between and in physical contact with spacer 210 and CESL 214. Highly rigid seal material 532 can also be in contact with other structures not illustrated in FIG. 5. A planarization process can be used to remove horizontal portion 452A as illustrated in FIG. 4B or portions of first and second seal materials 412 and 432 as illustrated in FIG. 4E. The planarization process can continue until the top surfaces of gate electrode 216, gate dielectric layer 218, spacer 210, CESL 214, and S/D contacts 230 are exposed and are substantially level (e.g., on the same plane). After the planarization process, the corner portion 452A of seal layer 452 or remaining portions of first and second seal materials 412 and 432 can form highly rigid seal material 532. An air pocket entrapped by highly rigid seal material 532 can form air gaps 542 between terminals of semiconductor structure 200 such as gate structure 208 and S/D contacts 230. In some embodiments, air gaps 542 can include different types of air. For example, air gaps 542 can include oxygen, hydrogen, helium, argon, nitrogen, any other suitable types of air, and combinations thereof. A lower deposition rate of highly rigid seal material 532 can result in air gaps 542 having smaller volumes. For example, highly rigid seal material 532 can be formed by depositing seal layer 452 or first seal material 412 and second seal material 432, and a lower deposition rate can provide an air gap 542 having shorter height that results in a smaller air gap volume. As air gaps 542 can have a dielectric constant of about 1, the effective dielectric constant of spacer 210 and air gap 542 can be lower compared to a spacer structure that include spacers 210 and 214.

Referring to operation 712 of FIG. 7, dielectric layers and interconnect structures are formed, according to some embodiments. FIG. 6 is a cross-sectional view illustrating dielectric layers and interconnect structures formed on the semiconductor device.

A dielectric layer 620 can be formed on the top surfaces of gate electrode 216, gate dielectric layer 218, spacer 210, highly rigid seal material 532, CESL 214, S/D contacts 230, and other suitable structures. In some embodiments, dielectric layer 620 can be an etch stop layer. Dielectric layer 620 can be formed using a low-k dielectric material (e.g., a dielectric layer having a dielectric constant lower than about 3.9), such as silicon oxide. An inter-layer dielectric (ILD) layer 650 can be formed on dielectric layer 620. ILD layer 650 can be formed of a low-k dielectric material. For example, ILD layer 650 can be formed using silicon oxide. In some embodiments, dielectric layer 620 and ILD layer 650 can be formed using CVD, ALD, PVD, flowable CVD (FCVD), sputtering, any suitable deposition process, and combinations thereof. Vias can be formed in ILD 650 to establish electrical connection from S/D contacts 230 and gate electrode 216 to external circuitry, such as peripheral circuits formed above semiconductor structure 200. Gate vias 616 can be formed in ILD 650 and extend through dielectric layer 620 to be in physical contact with gate electrode 216. Similarly, S/D vias 630 can extend through ILD 650 and in physical contact with S/D contacts 230. Gate vias 616 and S/D vias 630 can be formed by a patterning and etching process. For example, openings can be formed in ILD 650 and through dielectric layer 620 to expose gate electrode 216 and S/D contact 230, respectively. A deposition process can be performed to deposit conductive material in the openings such that electrical connections can be made. Examples of the deposition process can be PVD, sputtering, electroplating, electroless plating, any suitable deposition process, and combinations thereof. A planarization process can be performed after the deposition process such that top surfaces of ILD 650, gate vias 616, and S/D vias 630 can be substantially coplanar (e.g., level). In some embodiments, gate vias 616 and S/D vias 630 can be formed using tungsten, aluminum, cobalt, silver, any suitable conductive material, and combinations thereof.

The highly rigid seal material can also be used as etch stop layers to facilitate the subsequent formation of structures or as self-aligned contacts (SACs) for gate electrode 216 and S/D contacts 230. In some embodiments, SACs can be formed on a top surface of gate electrode 216 and/or S/D contacts 230. Forming SACs using a highly rigid seal material can provide the benefits of, among other things, electrical short prevention, low leakage current, high conformity, and good etch resistance. In some embodiments, SACs can be also formed of a dielectric material, such as silicon nitride, silicon oxide, silicon oxynitride, silicon oxycarbide, silicon oxycarbonitride, any suitable dielectric material, and/or combinations thereof. SACs can be formed on gate electrodes, on S/D contacts, or on both. For the sake of clarity, a single SAC scheme is used to describe a semiconductor device having an SAC formed only on one type of terminal, such as on gate electrodes or S/D contacts. Similarly, a dual SAC scheme can be used to describe a semiconductor device having SAC formed on at least two types of terminals, such as on both gate electrodes and S/D contacts. FIGS. 8-16 describe various configurations of semiconductor devices, including single SAC schemes and dual SAC schemes having highly rigid seal layer formed in gaps and also as a CESL. In some embodiments, the highly rigid seal layer can also contain no seams due to the fabrication processes described above in FIGS. 4A-4F.

Figure 8:
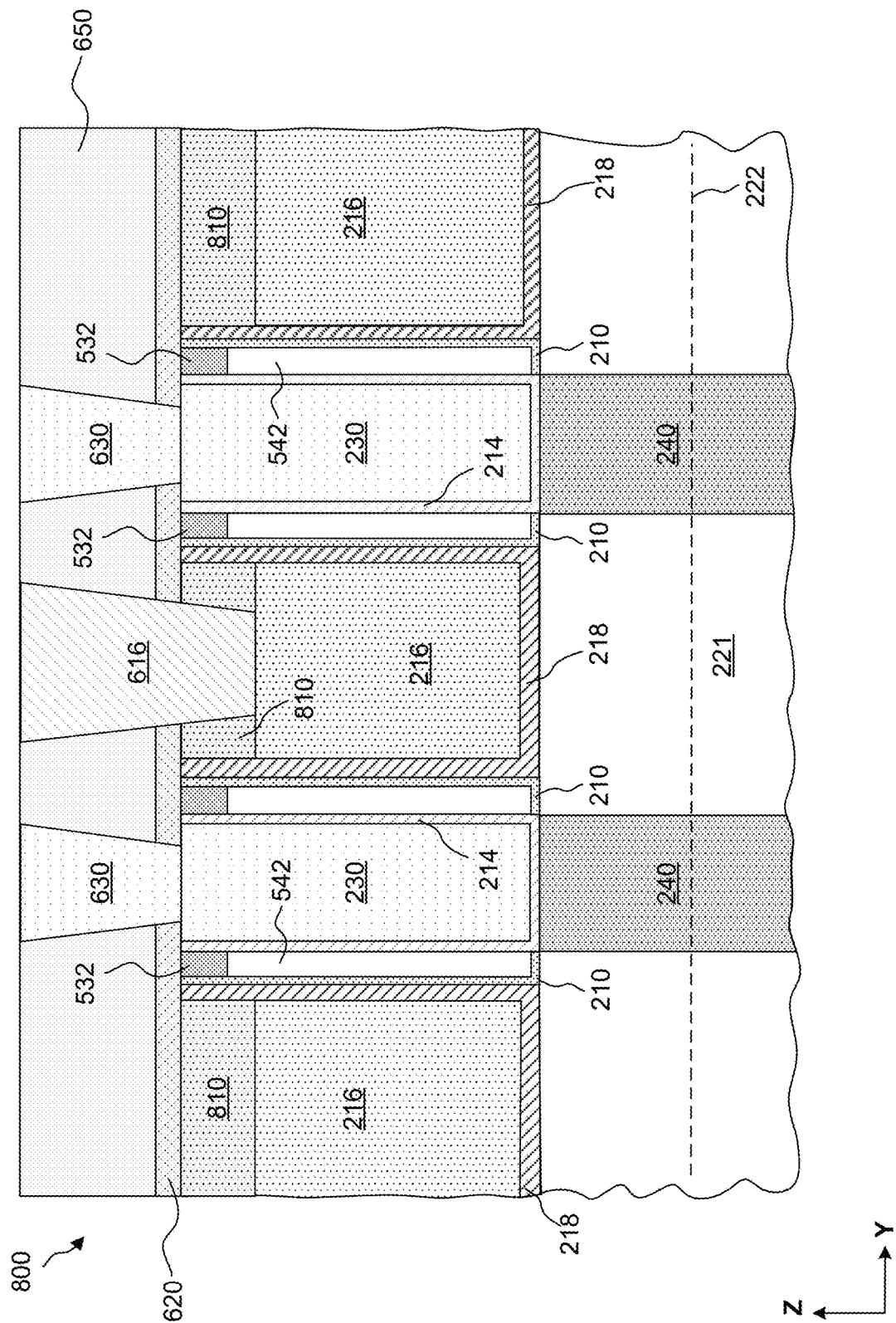
FIGS. 8-16 are cross-sectional views of various partially-formed semiconductor structures, in accordance with some embodiments.

FIG. 8 illustrates a semiconductor device 800 having a single SAC scheme and a highly rigid seal layer formed in gaps between terminals, according to some embodiments. Structures illustrated in FIG. 8 that are similar to those described in FIGS. 1-6 are not described in detail for simplicity. Semiconductor device 800 can incorporate a single SAC scheme and include SACs formed on gate electrode 216 or S/D contacts 230. For example, SAC 810 can be formed on top surfaces of gate electrode 216, as shown in FIG. 8. In some embodiments, SAC 810 can be formed on top surfaces of S/D contacts 230 (not shown in FIG. 8). SAC 810 can be formed by etching back a portion of gate electrode 216 such that a recess is formed on top of each gate electrode 216 and between opposing sidewalls of gate dielectric layer 218. A dielectric material can be deposited into the recess to form SAC 810. In some embodiments, SAC 810 can be formed using silicon oxide, silicon nitride, silicon oxycarbide, silicon oxynitride, silicon oxycarbonitride, any suitable dielectric material, and combinations thereof. In some embodiments, SAC 810 can be formed prior to the formation of highly rigid seal material 532. In some embodiments, SAC 810 can be formed after highly rigid seal material 532 is formed. A planarization process can be performed such that top surfaces of SAC 810, gate dielectric layer 218, spacer 210, CESL 214, and highly rigid seal material 532 are substantially coplanar (e.g., on the same plane). Dielectric layer 620, ILD 650, gate vias 616, and S/D vias 630 can be formed on the planarized top surface. In some embodiments, gate vias 616 can extend through dielectric layer 620 and SAC 810 and become in physical contact with gate electrode 216.

Figure 9A:
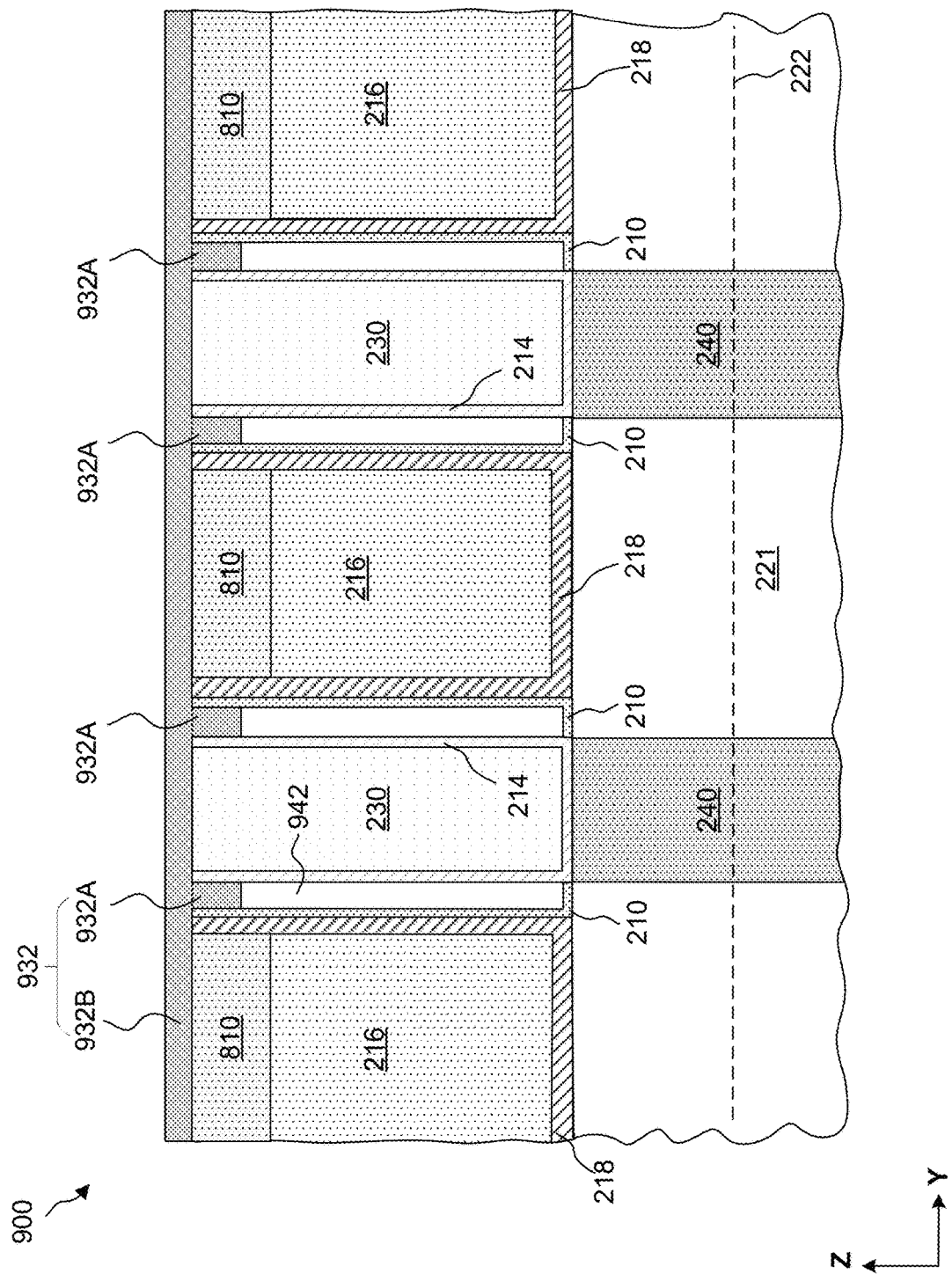
Figure 9B:
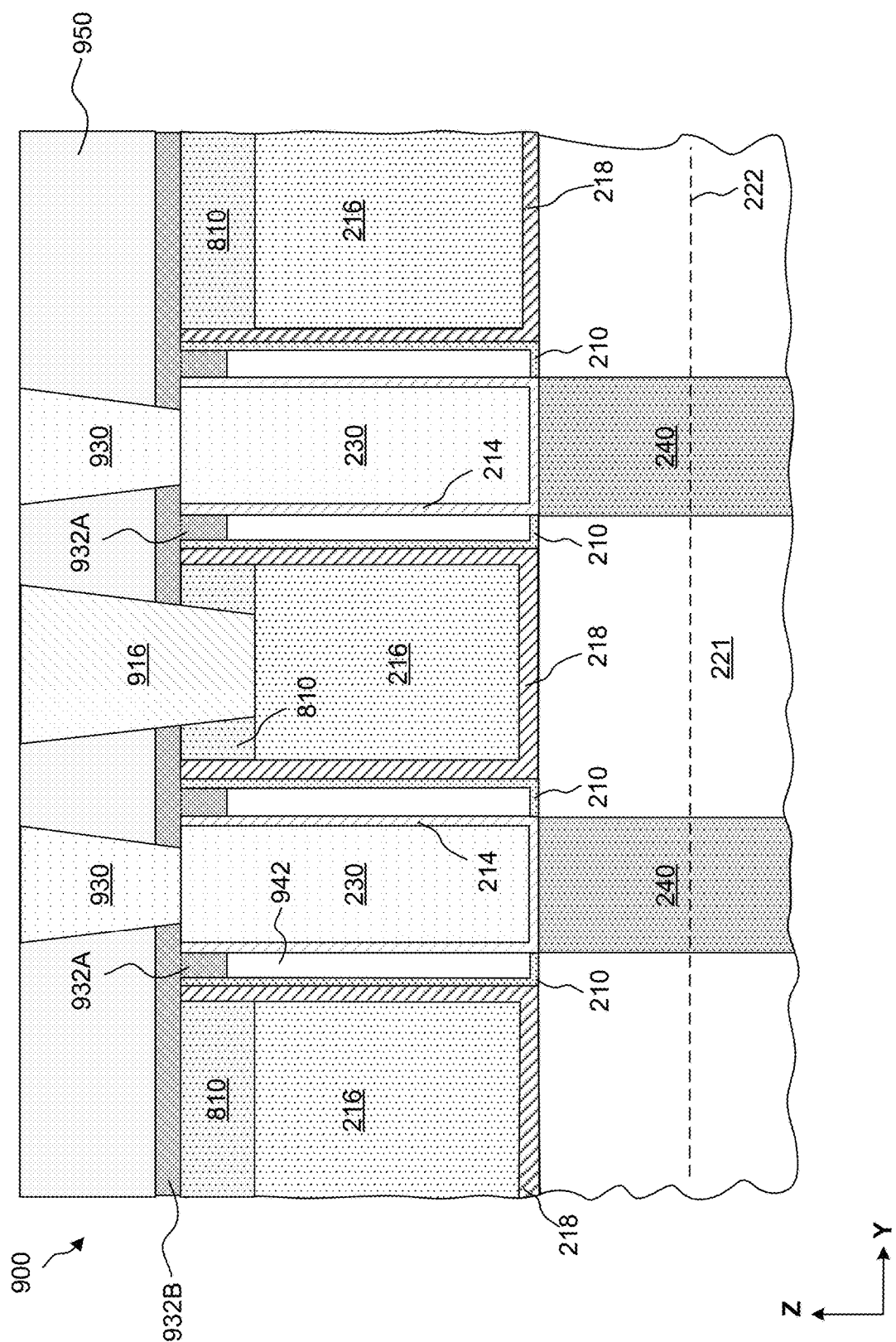

FIGS. 9A and 9B illustrate a semiconductor device 900 having a single SAC scheme and a highly rigid seal layer as a CESL and also as a gap seal layer between terminals, according to some embodiments. Structures illustrated in FIGS. 9A and 9B that are similar to those described in FIGS. 1-8 are not described in detail for simplicity. As shown in FIG. 9A, highly rigid seal material 932 can include a first portion 932A formed between terminals of semiconductor device 900 and a second portion 932B formed on top surfaces of SAC 810, gate dielectric layer 218, spacers 210, S/D contacts 230, and CESL 214. Highly rigid seal material 932 can be formed using methods similar to those described above in FIGS. 4A-4F and FIG. 7 and is not described here in details for simplicity. Air gaps 942 can be formed between terminals of semiconductor device 900 and the dimensions of air gaps 942 can depend upon various factors, such as the deposition rate of highly rigid seal material 932. In some embodiments, the density of highly rigid seal material 932 can be adjusted based on device design. For example, increasing the density of highly rigid seal material 932 can provide, among other things, greater etch resistance. In some embodiments, second portion 932B of highly rigid seal material 932 can be used as a CESL for forming subsequent structures, such as vias for SACs 810 and S/D contacts 230, as further described below with reference to FIG. 9B.

As shown in FIG. 9B, an ILD layer 950 can be formed on second portion 932B of highly rigid seal material 932B. ILD layer 950 can be similar to ILD layer 650 described in FIG. 6. For example, ILD layer 950 can be formed using silicon oxide. In some embodiments, ILD layer 950 can be formed using CVD, ALD, PVD, flowable CVD (FCVD), sputtering, any suitable deposition process, and combinations thereof. Vias can be formed in ILD 950 to establish electrical connection from S/D contacts 230 and gate electrode 216 to external circuitry, such as peripheral circuits formed above semiconductor structure 200. Gate vias 916 can be formed in ILD 650 and extend through second portion 932B of highly rigid seal material 932 to be in physical contact with gate electrode 216. Similarly, S/D vias 630 can extend through ILD 650 and in physical contact with S/D contacts 230. Gate vias 616 and S/D vias 630 can be formed by a patterning and etching process. For example, openings can be formed in ILD 650 and by a patterning and etching process to expose the underlying second portion 932B of highly rigid seal material 932. Second portion 932B can serve as a CESL during the formation process of the openings. The high density (e.g., greater than about 2.0 g/cm$^3$) of highly rigid seal material 932 can provide improved etch resistance. A deposition process can be performed to deposit conductive material in the openings to form gate vias 916 and S/D vias 930 such that electrical connections can be made. Examples of the deposition process can be PVD, sputtering, electroplating, electroless plating, any suitable deposition process, and combinations thereof. A planarization process can be performed after the deposition process such that top surfaces of ILD 950, gate vias 916, and S/D vias 930 can be substantially coplanar (e.g., on the same plane). In some embodiments, gate vias 916 and S/D vias 930 can be formed using tungsten, aluminum, cobalt, silver, any suitable conductive material, and combinations thereof. In some embodiments, gate vias 916 can extend through second portion 932B and SAC 810 and in physical contact with gate electrode 216.

FIGS. 10A-10D illustrate a semiconductor device 1000 having a single SAC scheme and a highly rigid seal layer as a SAC and also as a gap seal layer between terminals, according to some embodiments. Structures illustrated in FIGS. 10A-10D that are similar to those described in other figures, such as FIGS. 2 and 8, are not described in detail for simplicity.

Figure 10A:
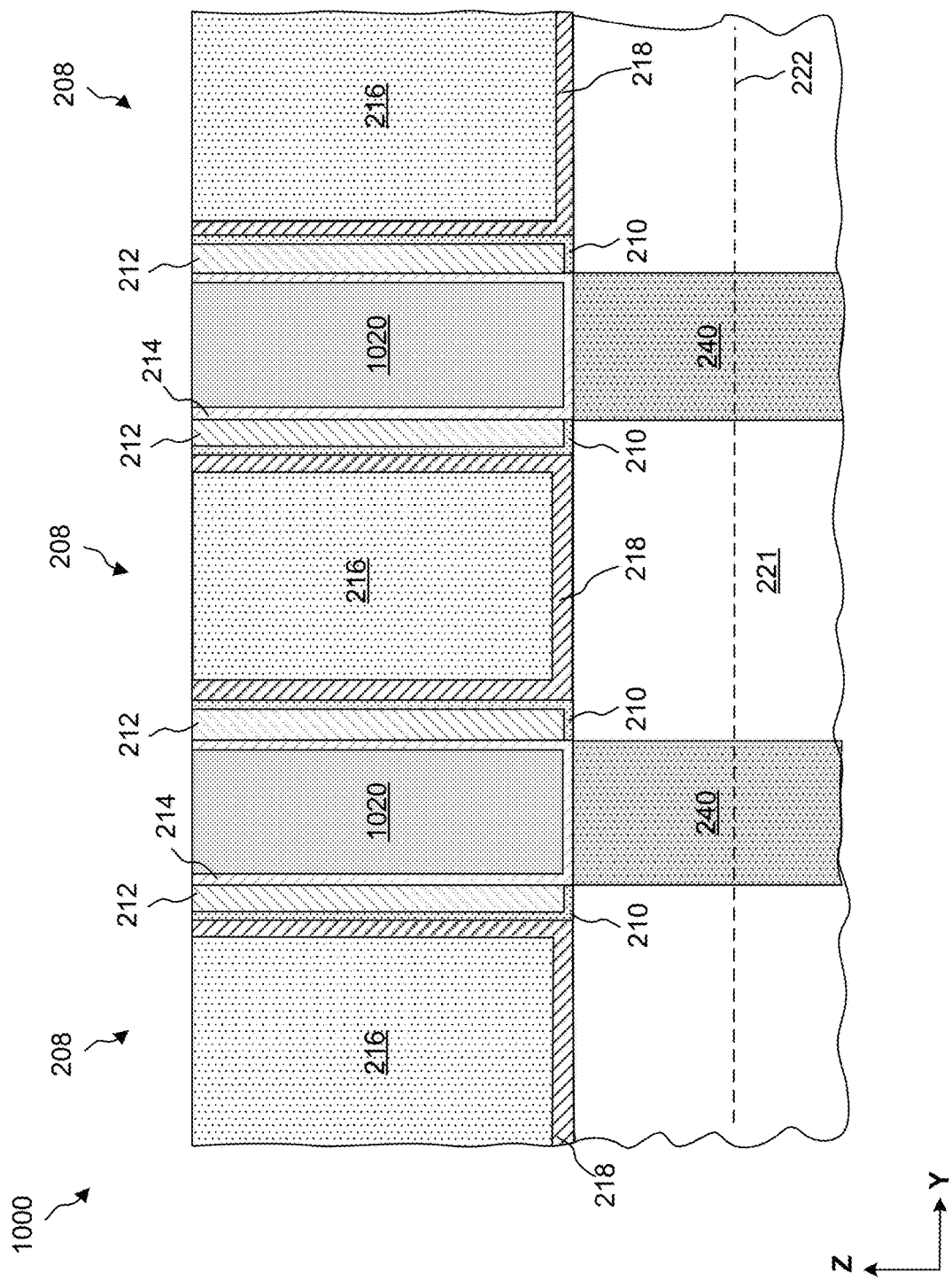

FIG. 10A is a cross-sectional view of semiconductor device 1000 having terminals and spacers formed between terminals, according to some embodiments. For example, semiconductor device 1000 can include gate electrodes 216 and spacers 210 and 212. In some embodiments, SACs formed using a highly rigid seal material can be formed after S/D contacts are formed. In some embodiments, SACs can be formed prior to the formation of S/D contacts. S/D contacts can be formed by a replacement process, such as removing a dielectric layer and depositing conductive in place of the dielectric layer. As shown in FIG. 10A, dielectric layer 1020 is formed on CESL 214 and above S/D regions 240. Dielectric layer 1020 can be formed using material similar to those that form ILD 650 and ILD 950. For example, dielectric layer 1020 can be formed using silicon oxide. Dielectric layer 1020 can be removed and replaced by one or more conductive materials, as further described below in FIG. 10B.

Figure 10B:
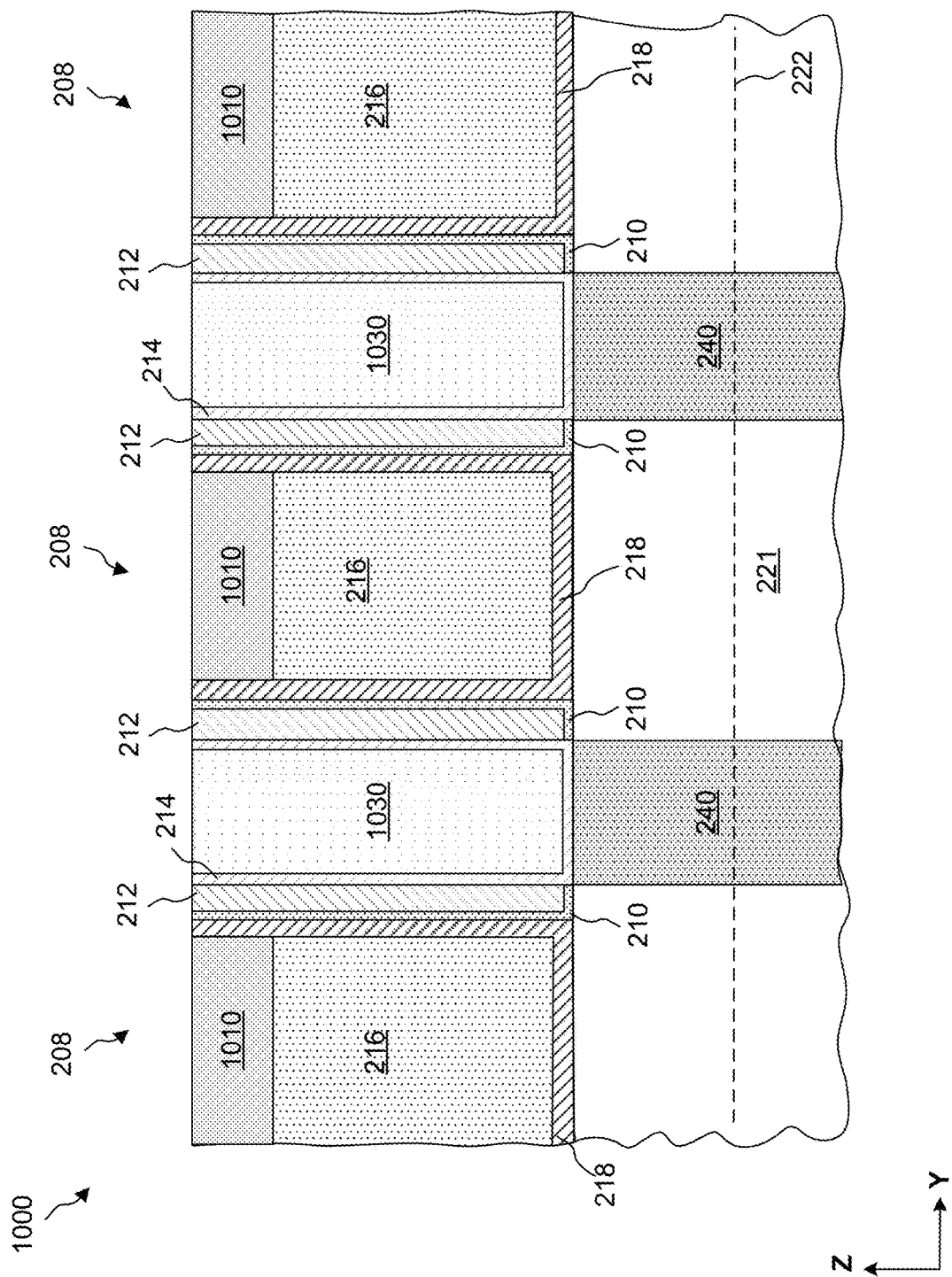

FIG. 10B is a cross-sectional view of semiconductor device 1000 after SACs using highly rigid seal materials and S/D contacts are formed. As shown in FIG. 10B, S/D contacts 1030 are formed in place of dielectric layer 1020. In some embodiments, S/D contacts are formed by removing dielectric layer 1020 and performing a deposition process to fill the void left by removing dielectric layer 1020. The deposition process can include depositing conductive material until a top surface of the deposited conductive material is at least level with top surfaces of gate dielectric layer 218 and spacers 210. The conductive material can include any suitable conductive materials, such as metal, metal alloy, doped semiconductor material, and/or combinations thereof.

SACs 1010 can be formed on gate electrodes 216 using an etch back process similar to the etch back process used to form SACs 810 described above with reference to FIG. 8. For example, one or more etching processes can be performed to etch back gate electrodes 216 to form an opening between opposing sidewalls of gate dielectric layer 218. Highly rigid seal material can be blanket deposited on exposed surfaces and into the opening until the highly rigid seal material completely fills the opening. A planarization process can be used to remove any excessive highly rigid seal material such that SACs 1010 are formed on top surfaces of recessed gate electrodes 216. SACs 1010 can be formed using a method similar to those described above with reference to FIGS. 4A-4F. For example, SACs 1010 can be formed using HRSCO. In some embodiments, the oxygen content of SACs 1010 can be adjusted per device needs.

Figure 10C:
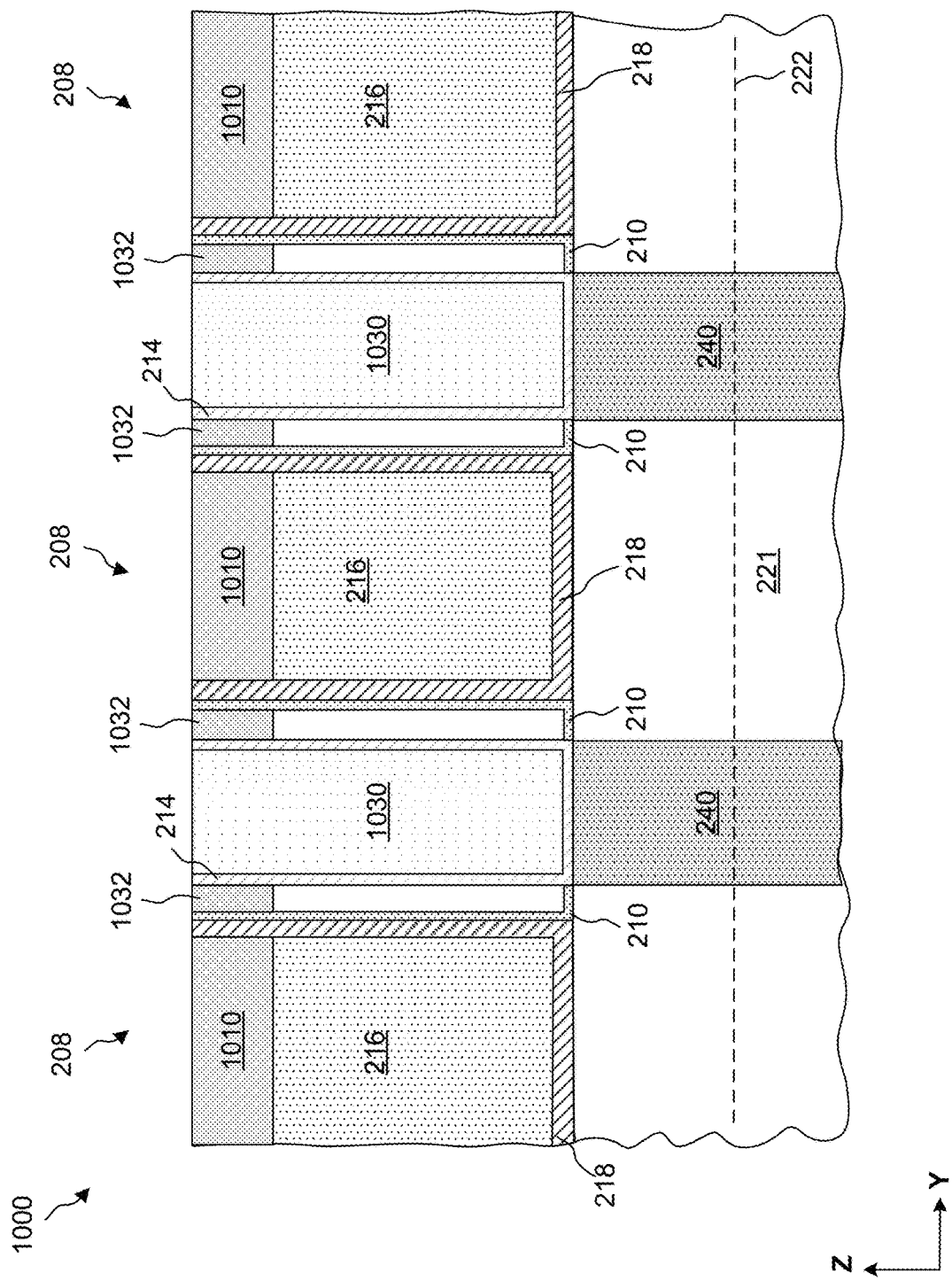

FIG. 10C is a cross-sectional view of semiconductor device 1000 after highly rigid seal materials are deposited into gaps between terminals of semiconductor device, according to some embodiments. Similar to the process described with reference to FIG. 3, spacers 212 can be removed to form openings between terminals of semiconductor device 1000. Highly rigid seal material 1032 can be deposited into the openings and formed towards the top of the openings. The formation and properties of highly rigid seal material 1032 can be similar to the formation and properties of highly rigid seal material 532 described above in FIGS. 4A, 4B, and 5.

Figure 10D:
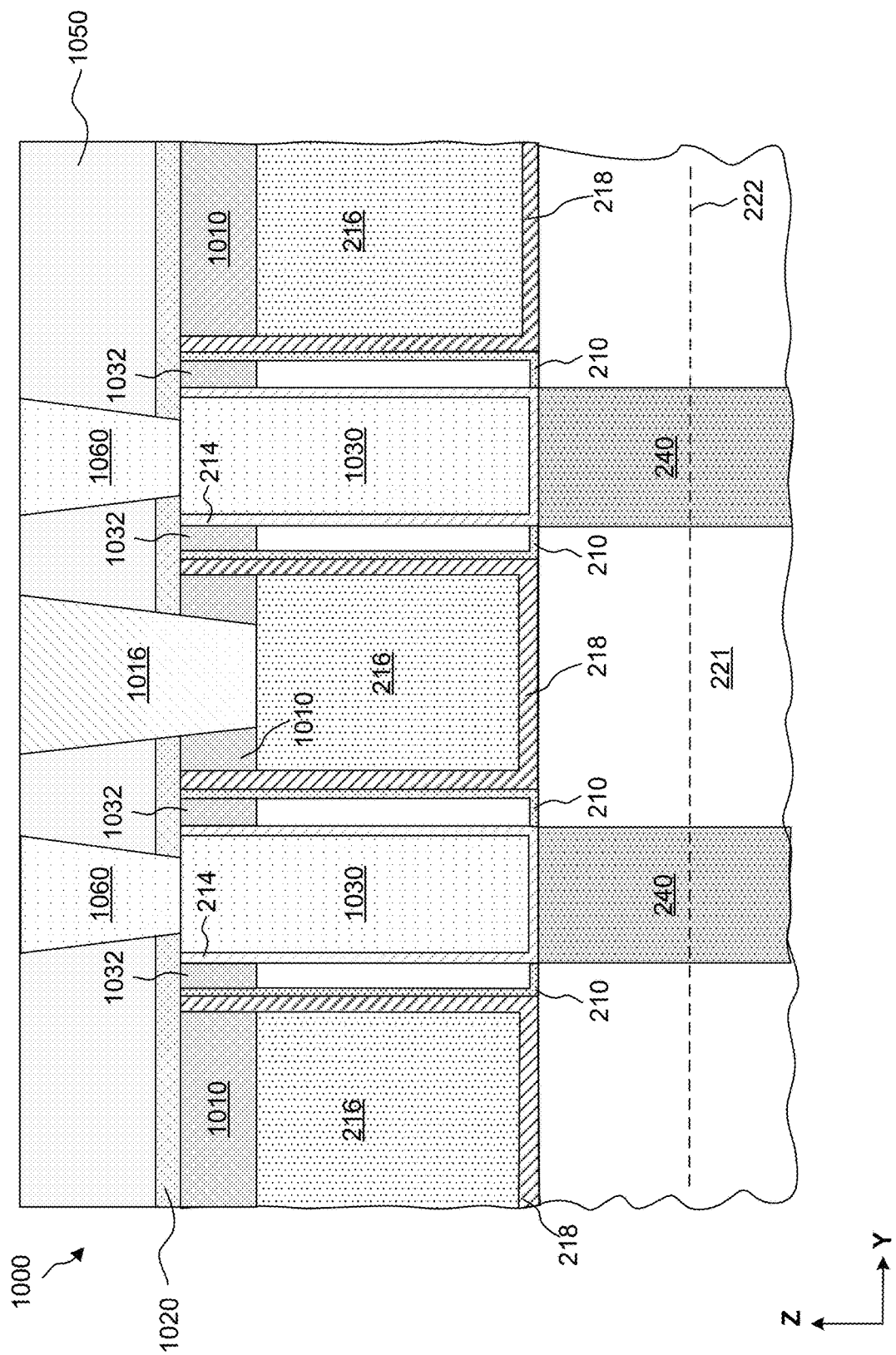

FIG. 10D is a cross-sectional view of semiconductor device 1000 after dielectric layers and interconnect structures are formed, according to some embodiments. As shown in FIG. 10D, dielectric layer 1020 and ILD layer 1050 can be formed over SACs 1010, S/D contacts 1030, and other exposed structures of semiconductor device 1000. In some embodiments, dielectric layer 1020 can be a CESL. Gate vias 1016 and S/D vias 1060 can be formed in ILD 1050 and extend through dielectric layer 1020. In some embodiments, gate vias 1016 can extend through dielectric layer 1020 and SAC 1010 and become in physical contact with gate electrode 216. In some embodiments, dielectric layer 1020, ILD 1050, gate vias 1016, and S/D vias 1060 can be respectively similar to dielectric layer 620, ILD 650, gate vias 616, and S/D vias 616 and are not described here in details for simplicity.

Figure 11A:
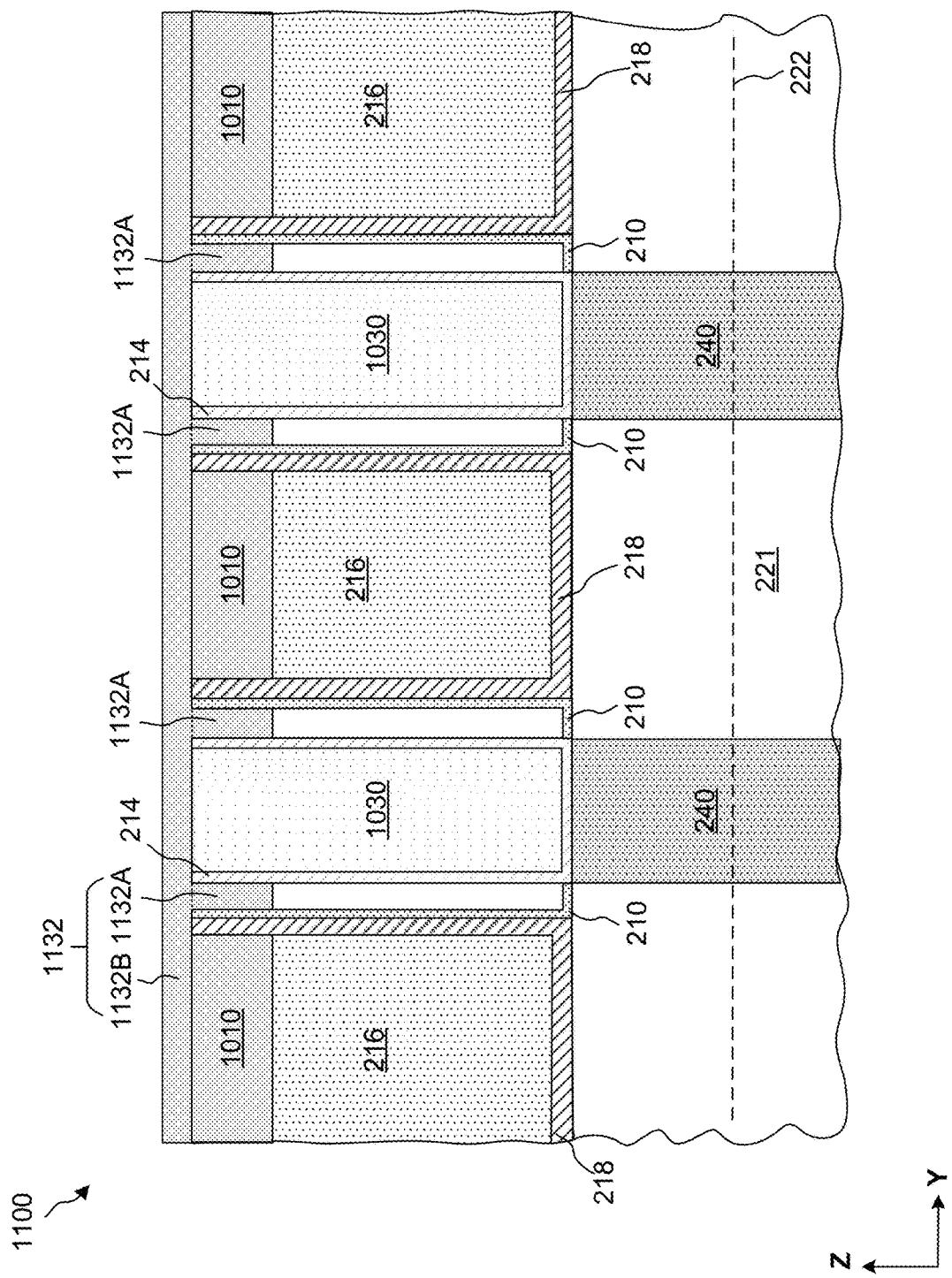
Figure 11B:
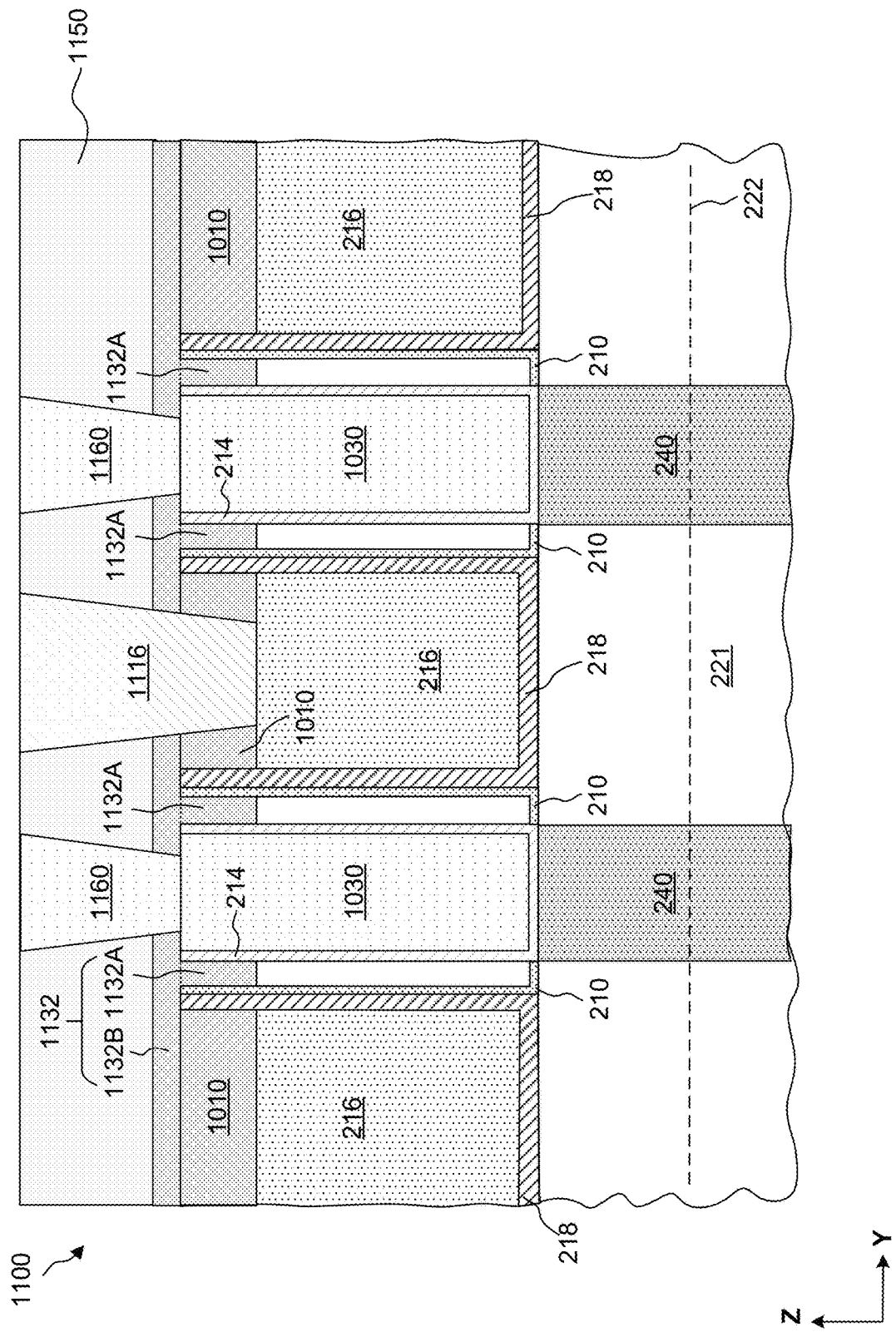

FIGS. 11A and 11B illustrate a semiconductor device 1100 having a single SAC scheme and a highly rigid seal layer as a SAC, CESL, and also as a gap seal layer between terminals, according to some embodiments. Structures illustrated in FIGS. 11A and 11B that are similar to those described in other figures, such as FIGS. 8, 9A, 9B, and 10, are not described in detail for simplicity.

FIG. 11A is a cross-sectional view of semiconductor device 1100 having a highly rigid seal material as SACs, CESL, and gap seal layers. For example, highly rigid seal material 1132 can include a first portion 1132A formed between terminals of semiconductor device 1100 and used as a gap seal layer to form air gaps 1142. Highly rigid seal material 1132 can include a second portion 1132B formed on top surfaces of SACs 1010, spacers 210, gate dielectric layer 218, S/D contacts 1030, and other suitable structures. First and second portions 1132A and 1132B of highly rigid seal material 1132 can be respectively similar to first and second portions 932A and 932B of highly rigid seal material 932 described above in FIGS. 9A and 9B and are not described in detail here for simplicity. Second portion 932B of highly rigid seal material 932 can be used as a CESL for subsequently forming dielectric layers and interconnect structures. Highly rigid seal material 1132 can provide the benefits of, among other things, high etch resistance, lower leak current, and high conformity. In some embodiments, having SACs, CESL, and gap seal material all formed using a highly rigid material such as HRSCO can also provide the benefit of low contamination because SAC and gap seal material can be deposited in situ without the need of removing semiconductor device 1100 from one deposition chamber and loading it into another.

FIG. 11B is a cross-sectional view of semiconductor device 1100 after dielectric layers and interconnect structures are formed, according to some embodiments. As shown in FIG. 11D, ILD layer 1150 can be formed over SACs 1010, S/D contacts 1030, and other exposed structures of semiconductor device 1100. Gate vias 1116 and S/D vias 1160 can be formed in ILD 1150 and extend through second portion 1132B of highly rigid seal material 1132. In some embodiments, gate vias 1116 can extend through dielectric second portion 1132B and SAC 1010 and can be in physical contact with gate electrode 216. In some embodiments, ILD 1150, gate vias 1116, and S/D vias 1160 can be respectively similar to ILD 650, gate vias 616, and S/D vias 616 and are not described here in details for simplicity.

Figure 12:
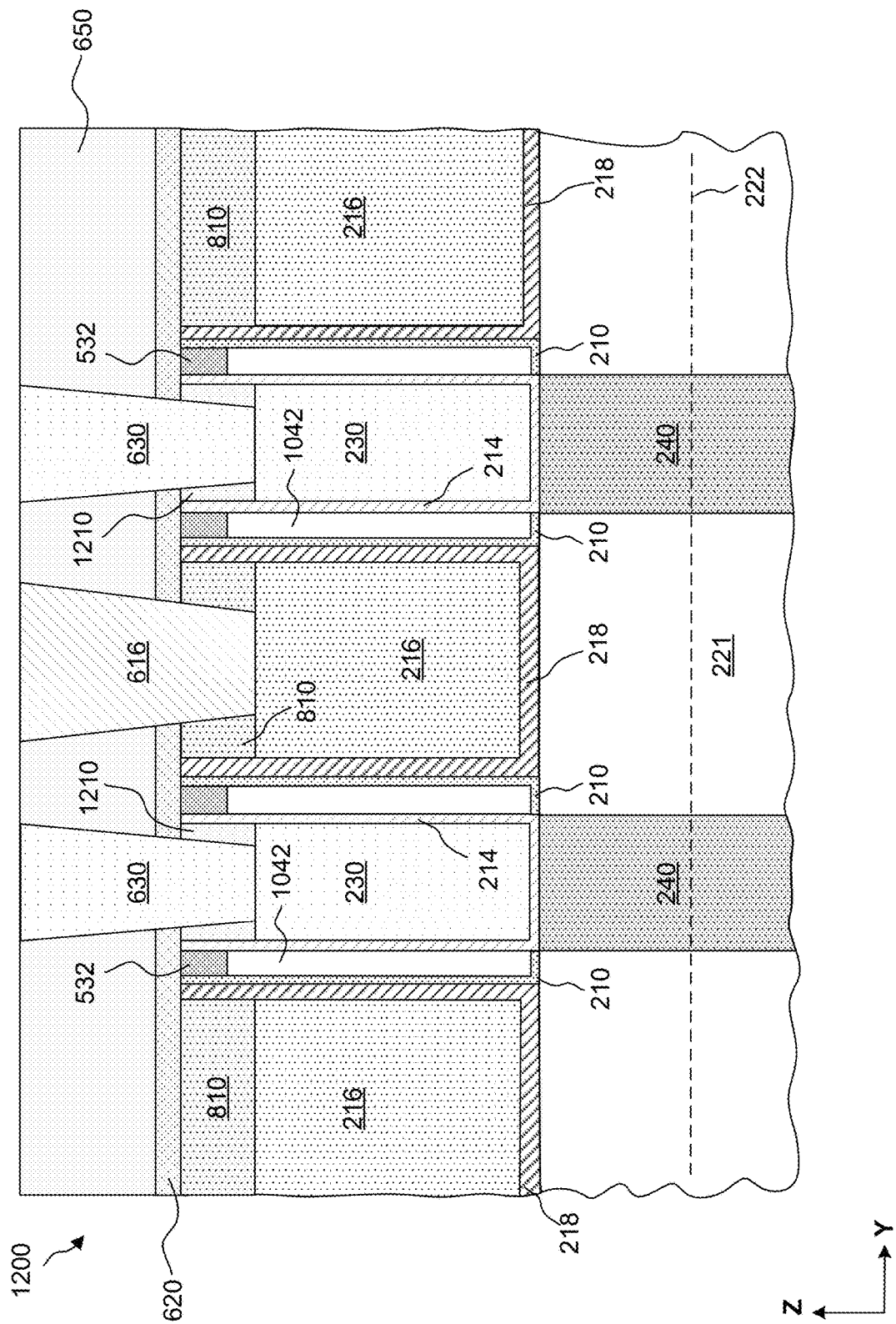

FIG. 12 illustrates a semiconductor device 1200 having a dual SAC scheme and a highly rigid seal layer as a gap seal layer between terminals, according to some embodiments. Structures illustrated in FIG. 12 that are similar to those described in other figures, such as FIGS. 2-11B, are not described herein in detail for simplicity. A dual SAC scheme includes SACs formed on more than one type of terminals in semiconductor device 1200. For example, SAC 810 can be formed on gate electrode 216. In some embodiments, SACs 1210 can be formed on S/D contacts 230. SACs 1210 can be formed using a material similar to that of SAC 810. For example, SACs 1210 can be formed using silicon oxide. Highly rigid layer 532 can be formed between terminals of semiconductor device 1200 as a gap seal layer to form gaps 1042 that is surrounded by highly rigid layer 532, spacer 210, and CESL 214. In some embodiments, SAC 1210 can be formed prior to the formation of SAC 810. In some embodiments, SAC 1210 can be formed after the formation of SAC 810. SACs 810 and 1210 can be formed via an etch back process to recess the semiconductor device terminals followed by a deposition process to deposit dielectric material on the recessed semiconductor device terminals. For example, SAC 1210 can be formed by an etch back process to recess S/D contacts 230 and a deposition of dielectric material on the recessed S/D contacts 230. An exemplary fabrication process for forming semiconductor device 1200 can include etching back gate electrode 216 and depositing dielectric material on the recessed gate electrode 216 to form SACs 810, forming S/D contacts 230 over S/D regions 240, forming openings between terminals of semiconductor device 1200, forming highly rigid layer 532 in the openings, depositing dielectric layer 620, depositing ILD layer 650 on dielectric layer 620, and forming gate vias 616 and S/D vias 630 in ILD layer 650 and through dielectric layer 620. In some embodiments, gate vias and S/D vias can extend through SACs 810 and 1210, respectively. Other operations can be used in forming semiconductor device 1200 and the sequence of the operations can vary.

Figure 13:
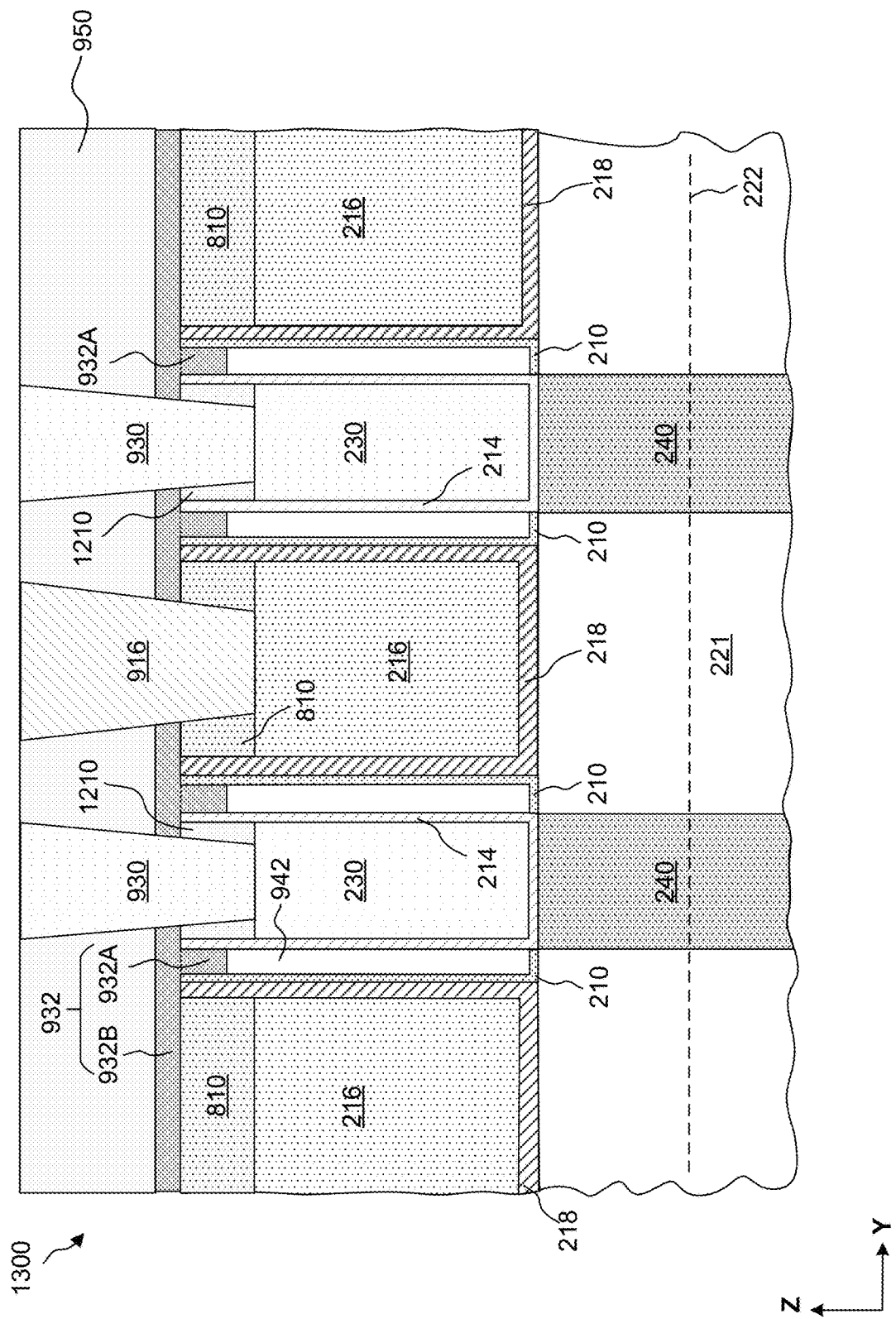

FIG. 13 illustrates a semiconductor device 1300 having a dual SAC scheme and a highly rigid seal layer that serves as a gap seal layer between terminals and also as a CESL, according to some embodiments. Structures illustrated in FIG. 13 that are similar to those described in other figures, such as FIGS. 2-12, are not described in detail for simplicity. For example, highly rigid seal material 932 can include first portion 932A formed between terminals of semiconductor device 1300 and second portion 932B formed on top surface of various structures. Second portion 932B can be used as a CESL for forming gate vias 916 and S/D vias 930. Air gaps 942 are surrounded by CESL 214, spacer 210, and highly rigid seal material 932. In some embodiments, highly rigid seal material 932 can be formed using a fabrication method similar to those described with reference to FIGS. 4A-4F. An exemplary fabrication process for forming semiconductor device 1300 can include, etching back gate electrode 216 and depositing dielectric material on the recessed gate electrode 216 to form SACs 810, forming S/D contacts 230 over S/D regions 240, etching back S/D contacts 230 and depositing dielectric material to form SACs 1210, forming openings between terminals of semiconductor device 1200, forming first portion 932A of highly rigid layer 932 in the openings and second portion 932B on top surfaces of the terminals, depositing ILD layer 950 on highly rigid layer 932, and forming gate vias 916 and S/D vias 930 in ILD layer 950 and through highly rigid layer 932. In some embodiments, gate vias 916 and S/D vias 930 extend through SACs 810 and 1210, respectively. Other operations can be used in forming semiconductor device 1300 and the sequence of the operations can vary.

Figure 14:
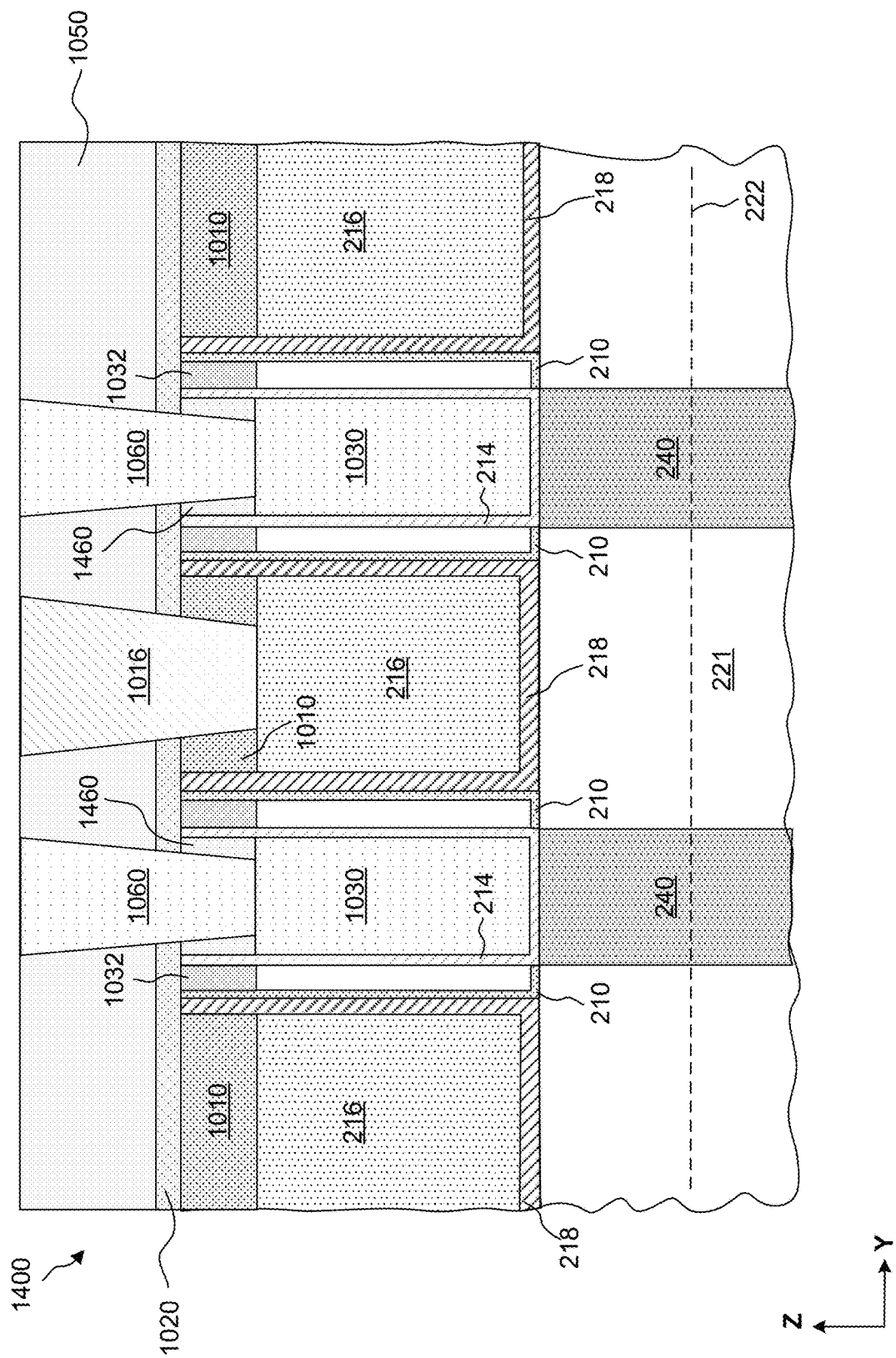

FIG. 14 illustrates a semiconductor device 1400 having a dual SAC scheme and a highly rigid seal layer that serves as a gap seal layer between terminals and also as a SAC for S/D contacts, according to some embodiments. Structures illustrated in FIG. 14 that are similar to those described in other figures, such as FIGS. 2-13, are not described in detail for simplicity. In some embodiments, highly rigid seal material 1032 can be formed using HRSCO. In some embodiments, highly rigid seal material 1032 can be formed between terminals of semiconductor device 1400. In some embodiments, SACs 1460 can be formed on S/D contacts 1030. In some embodiments, SACs 1460 can be formed using a material similar to that of highly rigid seal material 1032. In some embodiments, SACs 1460 can be formed using an etch back process similar to the etch back process described above with reference to FIG. 10A-10D. In some embodiments, highly rigid seal material 1032 and SACs 1460 can be formed during the same fabrication operation. For example, S/D contact 1030 can be etched back to form a recess between opposing sidewalls of CESL 1030. One or more spacers between terminals of semiconductor device 1400 can be removed to form openings between the terminals. A fabrication process including the deposition of highly rigid material and one or more treatment processes can be used to deposit highly rigid material in the openings between terminals and also on recessed S/D contacts 1030 to form SACs 1460. In some embodiments, highly rigid seal material 1032 can be formed using fabrication method similar to those described with reference to FIGS. 4A-4F. An exemplary fabrication process for forming semiconductor device 1400 can include, etching back gate electrode 216 and depositing dielectric material on the recessed gate electrode 216 to form SACs 1010, forming S/D contacts 1030 over S/D regions 240, etching back S/D contacts 1030, forming openings between S/D contacts and gate electrodes 216, depositing highly rigid material to form highly rigid seal material 1032 in the openings and SACs 1460 on S/D contacts 1030, depositing dielectric layer 1020 on top surfaces of the terminals and highly rigid seal material 1032, performing a planarization process, depositing ILD layer 1050, and forming gate vias 1016 and S/D vias 1060 in ILD layer 1050 and through dielectric layer 1020. In some embodiments, gate vias 1016 and S/D vias 1060 extend through SACs 1010 and 1460, respectively. Other operations can be used in forming semiconductor device 1400 and the sequence of the operations can vary.

Figure 15:
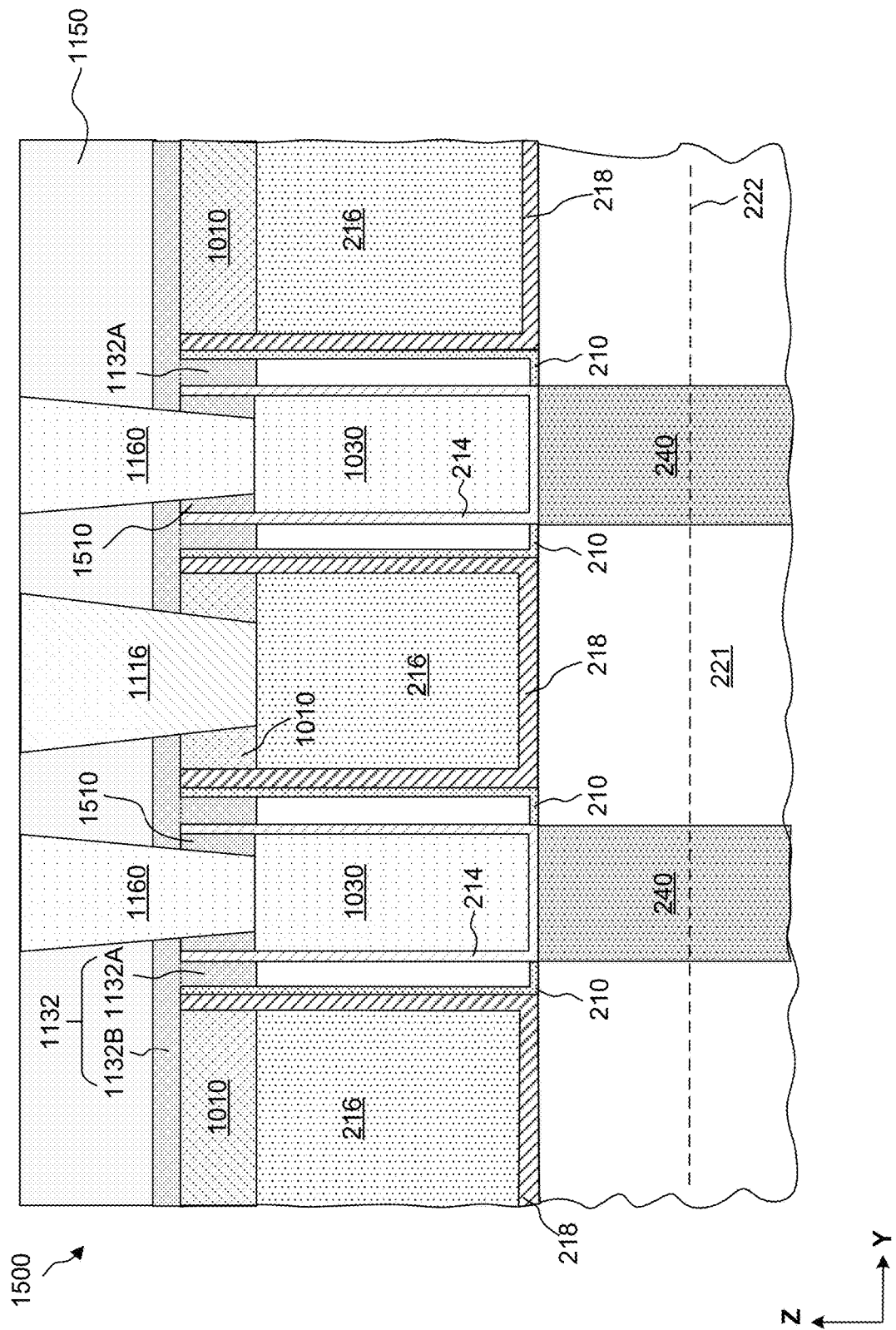

FIG. 15 illustrates a semiconductor device 1500 having a dual SAC scheme and a highly rigid seal layer that serves as (i) a gap seal layer between terminals, (ii) a SAC for the S/D contacts, and (iii) a CESL, according to some embodiments. Structures illustrated in FIG. 15 that are similar to those described in other figures, such as FIGS. 2-14, are not described in detail for simplicity. In some embodiments, highly rigid seal material 1132 can include first portions 1132A formed between terminals of semiconductor device 1500 and a second portion 1132B extending horizontally and formed on top surfaces of the terminals. The terminals can include gate electrode 216 and S/D contacts 1030. In some embodiments, highly rigid materials can also be used to form SACs. For example, SACs 1510 for S/D contacts 1030 can be formed using highly rigid seal materials. In some embodiments, SACs 1010 and highly rigid seal material 1132 can be formed in the same fabrication step and compose of substantially the same type of material. For example, SACs 1010 and highly rigid seal material 1132 can have substantially the same oxygen atomic percentage. In some embodiments, SACs 1010 and highly rigid seal material 1132 can be formed using highly rigid materials having different compositions. The dual SAC scheme employed by semiconductor device 1500 can also include SACs for gate electrodes 216. For example, SACs 1010 can be formed on the top surfaces of gate electrode 216. SACs 1010 can be formed using highly rigid seal materials. In some embodiments, SACs 1010 can be formed using dielectric materials, such as silicon oxide, silicon nitride, silicon carbide, silicon oxynitride, silicon oxycarbonitride, and any suitable dielectric materials. An exemplary fabrication process of semiconductor device 1500 having the dual SAC scheme and the highly rigid seal material can include, for example, etching back to recess gate electrodes 216, depositing dielectric materials on the recessed gate electrodes to form SACs 1010, etching back to recess S/D contacts 1030, forming openings between S/D contacts 1030 and gate electrodes 216, depositing highly rigid seal material in the openings and on recessed S/D contacts 1030 and on SACs 1010, performing a planarization process, forming ILD 1150, and forming gate vias 1116 and S/D vias 1160. In some embodiments, gate vias 1116 and S/D vias 1160 can extend through SACs 1010 and 1510, respectively. Other operations can be used in forming semiconductor device 1500 and the sequence of the operations can vary.

Figure 16:
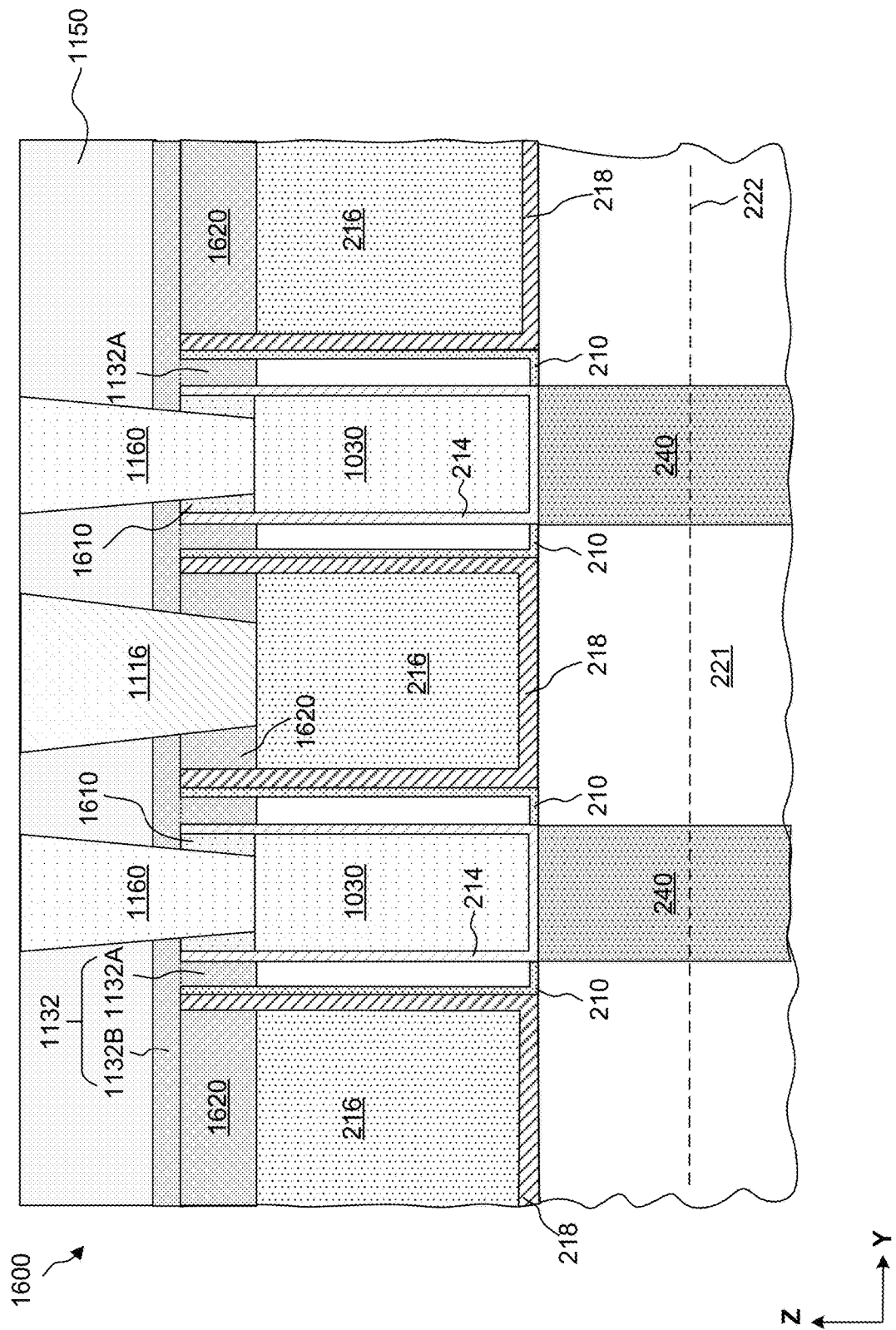

FIG. 16 illustrates a semiconductor device 1600 having a dual SAC scheme and a highly rigid seal layer that serves as a gap seal layer between terminals, as a SAC for the gate electrodes, and also as a CESL, according to some embodiments. Structures illustrated in FIG. 16 that are similar to those described in other figures, such as FIGS. 2-15, are not described in detail for simplicity. In some embodiments, highly rigid seal material 1132 can include first portions 1132A formed between terminals of semiconductor device 1600 and a second portion 1132B extending horizontally and formed on top surfaces of the terminals. In some embodiments, highly rigid materials can also be used to form SACs. For example, SACs 1620 for gate electrodes 216 can be formed using highly rigid seal materials. In some embodiments, SACs 1620 and highly rigid seal material 1132 can be formed in the same fabrication step and compose of substantially the same type of material. For example, SACs 1620 and highly rigid seal material 1132 can have substantially the same oxygen atomic percentage. In some embodiments, SACs 1620 and highly rigid seal material 1132 can be formed using highly rigid materials having different compositions. The dual SAC scheme employed by semiconductor device 1600 can also include SACs for S/D contacts 1030. For example, self-aligned S/D contact such as SACs 1610 can be formed on the top surfaces of S/D contacts 1030. In some embodiments, SACs 1610 can be formed using highly rigid seal materials. In some embodiments, SACs 1610 can be formed using dielectric materials, such as silicon nitride, silicon oxide, silicon carbide, silicon oxycarbide, silicon oxycarbonitride, and any suitable dielectric materials. An exemplary fabrication process of semiconductor device 1600 having the dual SAC scheme and the highly rigid seal material can include, for example, etching back to recess gate electrodes 216, depositing highly rigid seal material on recessed gate electrodes to form SACs 1620, forming S/D contacts 1030, forming SACs 1610 on S/D contacts 1030, forming openings between S/D contacts 1030 and gate electrodes 216, depositing highly rigid seal material in the openings, SACs 1620, and on SACs 1610, performing a planarization process, forming ILD 1150, and forming gate vias 1116 and S/D vias 1160. Other operations can be used in forming semiconductor device 1600 and the sequence of the operations can vary.

Various embodiments of the present disclosure provide semiconductor devices and methods of fabricating the same to provide simple and cost-effective structures and process for producing highly rigid seal layers in semiconductor devices. The highly rigid seal layers can be used to seal an opening and form air gaps between terminals of semiconductor devices to reduce effective dielectric constant that in turn can improve device performance. The highly rigid seal material can also be formed on top surfaces of semiconductor device terminals as contact etch stop layers. The highly rigid seal material can also be used as self-aligned contacts for semiconductor device terminals.

In some embodiments, a semiconductor device includes first and second terminals formed on a fin region and a seal layer formed between the first and second terminals. The seal layer includes a silicon carbide material doped with oxygen. The semiconductor device also includes an air gap surrounded by the seal layer, the fin region, and the first and second terminals.

In some embodiments, a semiconductor device includes a gate structure on a fin region. The gate structure includes a gate electrode and a self-aligned contact (SAC) formed on the gate electrode. The SAC includes a silicon carbide material doped with oxygen. The semiconductor device also includes a source/drain (S/D) contact and a seal layer having the silicon carbide material doped with oxygen. The seal layer further includes a first portion between the gate structure and the S/D contact and a second portion on top surfaces of the SAC and the S/D contact. The semiconductor device also includes an air gap surrounded by the seal layer, the fin region, the gate electrode, and the S/D contact.

In some embodiments, a method for forming a semiconductor device includes forming an opening over a top surface of a substrate and between first and second terminals of the semiconductor device. The method also includes forming a silicon carbide material that includes depositing a first portion of the silicon carbide material in the opening and between the first and second terminals. The method also includes depositing a second portion of the silicon carbide material on top surfaces of the first and second terminals. A pocket of air is entrapped in the opening surrounded by the silicon carbide material, the first and second terminals, and the substrate. The method further includes performing an oxygen anneal process on the deposited first and second portions of the silicon carbide material.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor device, comprising:
first and second terminals formed on a fin region;
a self-aligned contact (SAC) formed on the first terminal, wherein the SAC comprises a first silicon carbide material doped with oxygen;
a seal layer formed between the first and second terminals, wherein the seal layer comprises a second silicon carbide material doped with oxygen;
a spacer on the first terminal and on the fin region;
a contact etch stop layer (CESL) on the second terminal; and
an air gap surrounded by the seal layer, the spacer, and the CESL.

2. The semiconductor device of claim 1, wherein the first terminal comprises a gate electrode and the second terminal comprises a source/drain (S/D) contact.

3. The semiconductor device of claim 2, wherein:
the first terminal further comprises a gate dielectric layer on a sidewall of the gate electrode; and
the spacer comprises a first portion on a sidewall of the gate dielectric layer and a second portion on a top surface of the fin region.

4. The semiconductor device of claim 3, wherein the air gap is in contact with the first and second portions of the spacer.

5. The semiconductor device of claim 1, wherein an oxygen atomic content of the seal layer is between about 30% and about 55%.

6. The semiconductor device of claim 1, wherein a carbon atomic content of the seal layer is between about 10% and about 35%.

7. The semiconductor device of claim 1, wherein a silicon atomic content of the seal layer is between about 25% and about 35%.

8. The semiconductor device of claim 1, wherein top surfaces of the seal layer, the first terminal, and the second terminal are substantially coplanar.

9. The semiconductor device of claim 1, Wherein the SAC has a top surface that is substantially coplanar with a top surface of the seal layer.

10. The semiconductor device of claim 1, Wherein the seal layer is formed on a sidewall of the spacer.

11. A semiconductor device, comprising:
a gate structure on a fin region, comprising:
a gate electrode; and
a self-aligned contact (SAC) formed on the gate electrode, wherein the SAC comprises a first silicon carbide material doped with oxygen;
a spacer in contact with the gate structure;
a source/drain (S/D) contact;
a contact etch stop layer (CESL) in contact with the S/D contact;

a seal layer comprising a second silicon carbide material doped with oxygen, wherein the seal layer further comprises:
- a first portion between the gate structure and the S/D contact; and
- a second portion on top surfaces of the SAC and the S/D contact; and an air gap surrounded by the seal layer, the spacer, and the CESL.

12. The semiconductor device of claim 11, wherein a density of the seal layer is between about 2.0 g/cm$^3$ and about 3.2 g/cm$^3$.

13. The semiconductor device of claim 11, wherein an oxygen atomic content of the seal layer is between about 30% and about 55%.

14. The semiconductor device of claim 11, further comprising a via extending through the second portion of the seal layer and in contact with the SAC.

15. The semiconductor device of claim 11, wherein the spacer comprises a first portion on a sidewall of a gate dielectric layer and a second portion on a top surface of the fin region.

16. A method for forming a semiconductor device, comprising:
- forming an opening over a top surface of a substrate and between first and second terminals of the semiconductor device;
- depositing a silicon carbide material in the opening and between the first and second terminals, wherein a pocket of air is entrapped in the opening surrounded by the silicon carbide material, the first and second terminals, and the substrate;
- performing an oxygen anneal process on the silicon carbide material; and
- depositing a dielectric layer on a top surface of the silicon carbide material and top surfaces of the first and second terminals.

17. The method of claim 16, wherein the silicon carbide material is deposited at a top portion of the opening.

18. The method of claim 16, wherein depositing the silicon carbide material comprises flowing tetramethyldisiloxane (TSMDSO), hydrogen gas, and oxygen gas into a deposition chamber.

19. The method of claim 18, wherein a flow ratio of the hydrogen gas to the oxygen gas is between about 20 and about 30.

20. The method of claim 16, further comprising:
- etching the first terminal to recess the first terminal;
- depositing another silicon carbide material on the recessed first terminal; and
- performing another oxygen anneal process on the another silicon carbide material.

* * * * *

UNITED STATES PATENT AND TRADEMARK OFFICE
CERTIFICATE OF CORRECTION

| | |
|---|---|
| PATENT NO. | : 11,502,166 B2 |
| APPLICATION NO. | : 17/100533 |
| DATED | : November 15, 2022 |
| INVENTOR(S) | : Liang et al. |

It is certified that error appears in the above-identified patent and that said Letters Patent is hereby corrected as shown below:

In the Claims

Column 28, Claim 9, Line 53, delete "Wherein" and insert -- wherein --, therefor.

Column 28, Claim 10, Line 56, delete "Wherein" and insert -- wherein --, therefor.

Signed and Sealed this
Twenty-first Day of February, 2023

*Katherine Kelly Vidal*

Katherine Kelly Vidal
*Director of the United States Patent and Trademark Office*